United States Patent [19]
Hamada et al.

[11] Patent Number: 6,081,153
[45] Date of Patent: Jun. 27, 2000

[54] LATCH CIRCUIT AND FLIP-FLOP CIRCUIT HAVING VOLTAGE LEVEL CONVERTING FUNCTION

[75] Inventors: Mototsugu Hamada, Yokohama; Tadahiro Kuroda, Koto-Ku, both of Japan

[73] Assignee: Kabushiki Kaisha Toshiba, Kanagawa-ken, Japan

[21] Appl. No.: 09/139,946

[22] Filed: Aug. 25, 1998

[30] Foreign Application Priority Data

Aug. 27, 1997 [JP] Japan ................................. 9-231272
Sep. 26, 1997 [JP] Japan ................................. 9-261741

[51] Int. Cl.[7] .................................................. H03K 3/289
[52] U.S. Cl. .......................... 327/333; 327/202; 327/203
[58] Field of Search ................................. 327/333, 202, 327/203, 208–212, 218; 326/62, 80, 81

[56] References Cited

U.S. PATENT DOCUMENTS

| 5,530,392 | 6/1996 | Runas et al. ............................. 327/333 |
|---|---|---|
| 5,559,996 | 9/1996 | Fujioka ................................... 327/333 |
| 5,699,002 | 12/1997 | Hayakawa ............................... 327/202 |
| 5,815,019 | 9/1998 | Uemura et al. .......................... 327/202 |
| 5,892,385 | 4/1999 | Hashiguchi ............................. 327/333 |

OTHER PUBLICATIONS

Kawaguchi, et al. "A Reduced Clock–Swing Flip–Flop (RCSFF) for 63% Clock Power Reduction," 1997 Symposium on VLSI Circuits Digest of Technical Papers, pp. 97–98.

Primary Examiner—Tuan T. Lam
Attorney, Agent, or Firm—Hogan & Hartson LLP

[57] ABSTRACT

A master slave type flip-flop circuit having a master latch circuit ML and a slave latch circuit SL has a voltage level converter circuit 20 in the slave latch circuit SL to reduce the number of elements used in the circuit, which results in reducing the power consumption and in increasing the operation speed of the circuit.

25 Claims, 17 Drawing Sheets

FIG. 10 (a) CLOCK SIGNAL CP
FIG. 10 (b) CLOCK SIGNAL CK
FIG. 10 (c) INPUT DATA SIGNAL ID
FIG. 10 (d) INTERMEDIATE OUTPUT SIGNAL FROM DATA OUTPUT TERMINAL Q1
FIG. 10 (e) VOLTAGE AT POINT E
FIG. 10 (f) VOLTAGE AT POINT F
FIG. 10 (g) OUTPUT DATA SIGNAL OD

LATCH CIRCUIT AND FLIP-FLOP CIRCUIT HAVING VOLTAGE LEVEL CONVERTING FUNCTION

BACKGROUND OF THE INVENTION

1. Field of the Invention

This invention relates to a latch circuit and a flip-flop circuit having a voltage level converting function and, more particularly, to a latch circuit and a flip-flop circuit having a voltage level converting function which are used in LSI operative with multiple power sources.

2. Description of the Prior Art

There are conventional LSI chips each having multiple power sources which partly share circuits in the chip to save power consumption. For example, a combinational logic circuit operative with a normal voltage VDD and a combinational logic circuit operative with a voltage VDDL lower than VDD are incorporated in a single LSI chip. In this type of LSI, it is necessary to convert the voltage level between the combinational logic circuit operative with the low voltage VDDL and the combinational logic circuit operative with the normal voltage VDD. That is, voltage level converter circuits are required. It is undesirable to locate such voltage level converter circuits in distant positions in the LSI chip because power consumption by the voltage level converter circuits themselves results in losing the power consumption decreasing effect by using two power sources in the chip. Therefore, it is believed to centralize the voltage level converter circuits near a flip-flop. Such a flip-flop circuit including voltage level converter circuit is usually called voltage level converting flip-flop circuit.

FIG. 15 shows a master slave type flip-flop circuit MSF of a usual type. The master slave type flip-flop circuit MSF includes a master latch circuit ML and a slave latch circuit SL. These master latch circuit ML and slave latch circuit SL are configured to pass data from a input terminal D and to output it from an output terminal Q when an input from a clock input terminal CLK is HIGH. When the input from the clock input terminal CLK is LOW, they function to hold data at the moment when the input rises to LOW. The signal input into the clock input terminal CLK of the master latch circuit ML shown in FIG. 15 is an inverted clock signal/CK. As a result, the master latch circuit ML exhibits a pass-through status for permitting data to pass through when the clock signal CK is LOW and exhibits a hold status for holding data when the clock signal CK is HIGH. In contrast, the signal input into the clock input terminal CLK of the slave latch circuit SL is a clock signal CK. As a result, the slave latch circuit SL exhibits a pass-through status for permitting data to pass when the clock signal CK is HIGH and exhibits a hold status for holding data when the clock signal CK is LOW. That is, the entirety of the master slave type flip-flop circuit MSF behaves as an edge trigger type flip-flop.

FIG. 16 through FIG. 18 show some examples of voltage level converting flip-flops made by combining a voltage level converter circuits with the master slave type flip-flop circuit MSF shown in FIG. 15. In FIG. 16, a voltage level converter circuit VC is located adjacent to the front end of the master slave type flip-flop MSF. In FIG. 17, the voltage level converter circuit VC is located adjacent to the rear end of the master slave type flip-flop MSF. In FIG. 18, the voltage level converter circuit VC is located adjacent to the read end similarly to the voltage level converting flip-flop shown in FIG. 17. The voltage level converting flip-flop circuit shown in FIG. 18 is different from the circuit of FIG. 17 in that an inverted output terminal/Q is provided at the output of the slave latch circuit SL and that the voltage level converter circuit VC uses an output signal from the inverted output terminal/Q. Therefore, the voltage level converter circuit VC shown in FIG. 18 includes an input terminal IN1 for introducing a signal from the output terminal Q of the slave latch circuit SL and an input terminal IN2 for introducing a signal from the inverted output terminal/Q of the same slave latch circuit SL.

In the voltage level converting flip-flop circuits referred to above, holding of data and conversion of the voltage level are executed independently, and it results in requiring more elements, hence requiring a larger circuit area, and hence slowing down the operation speed. Additionally, the voltage level converter circuit VC requires a power sufficient for operating independently, and results in increasing the entire power consumption.

Especially in the voltage level converting flip-flop circuit shown in FIG. 16, since it performs flip-flop operation after conversion of the voltage level, both the voltage level converter circuit VC and the master slave type flip-flop circuit MSF must be driven by the normal voltage VDD, and this invites a large power consumption. Additionally, since the master slave type flip-flop circuit MSF operates with the normal voltage VDD, it is a bar against a decrease in voltage for the clock signal CK. That is, the clock signal CK had to be operated with the normal voltage VDD and not with the lower voltage VDDL.

In contrast, in the voltage level converting flip-flops shown in FIGS. 17 and 18, voltage level conversion is done after flip-flop operation. Therefore, voltages of the input data signal ID and the clock signal CK could be decreased. That is, it was possible to activate the master slave type flip-flop circuit MSF with the lower voltage VDDL and to activate the voltage level converter circuit VC with the normal voltage VDD or with the normal voltage VDD and the lower voltage VDDL. However, there still remains the problem that the operation speed becomes slower because the entirety of the master slave type flip-flop circuit MSF operates with the lower voltage VDDL.

Another flip-flop circuit having a voltage level converting function is shown also in "1997 Symposium on VLSI Circuits Digest of Technical Papers, pp.97–98", for example. Here is shown is the flip-flop circuit shown in FIG. 22. As shown in FIG. 22, the flip-flop circuit is configured to introduce clock signals CK and input data signals ID changing within a low voltage VDDL from the left side of the drawing sheet and to release output data signal OD changing within the normal voltage VDD from the right side of the drawing sheet.

The flip-flop circuit shown in FIG. 22 requires that the threshold voltage in precharge p-type MOS transistors P1' and P2' be higher than those of the other MOS transistors to prevent the problem that, when the threshold voltage of the p-type MOS transistors P1' and P2' is low, these p-type MOS transistors P1' and P2' fail to become completely OFF even when the clock signal CK is HIGH, and result in leaving a leak current LC to flow. For example, focusing at the p-type MOS transistor P1', when the clock signal CK is HIGH, the p-type MOS transistor P1' must become completely OFF to cut a node X from the power source of the voltage VDD. However, when the threshold voltage of the p-type MOS transistor P1' is low, it does not become completely OFF even when the clock signal CK becomes HIGH, and a leak current LC flows from the power source of the voltage VDD to the node X. The same applies also to the p-type MOS transistor P2'. If the stationary leak current LC flows while the clock signal CK is HIGH in this manner, the power consumption increases, and the operation speed is slowed down. For these reasons, the threshold voltage of the p-type MOS transistors P1' and P2' must be set high.

In order to keep the threshold voltage high, conventional techniques relied on applying a threshold control voltage VWELL to the substrate of these p-type MOS transistors P1' and P2'. However, the use of the threshold control voltage VWELL invited the need for at least three kinds of voltage sources to activate the flip-flop circuit. That is, because the circuit required the voltage VDD for activating MOS transistors such as p-type MOS transistors P1' and P2' and the voltage VDDL for generating clock signals CK, etc., and for activating an inverter INV1' in addition to the threshold control voltage VWELL, totally three power sources different in voltage value had to be used.

On the other hand, there was a method for controlling the threshold voltage of the p-type MOS transistors P1' and P2' in a step of ion implantation during the manufacturing process of an integrated circuit. However, this approach resulted in making a MOS transistors having different threshold voltages within a single integrated circuit and hence resulted in increasing steps of the manufacturing process and the production cost.

SUMMARY OF THE INVENTION

It is therefore an object of the invention to provide a latch circuit and a flip-flop circuit having a voltage level converting function which promise a high-speed operation with a low power consumption. That is, the invention is intended to provide a latch circuit and a flip-flop circuit having a voltage level converting function which are operative at a high speed while decreasing voltages of input data signals and clock signals. To attain the object, it is intended to provide a latch circuit and a flip-flop circuit having a voltage level converting function which need less elements and a less circuit area.

In addition to this, as understood from FIG. 22, it is another object of the invention to provide a flip-flop circuit which prevents a leak current LC even when the clock signal CK changes within a voltage lower than the operating voltage of the flip-flop circuit. That is, it is intended to solve the problem that precharge p-type MOS transistors P1' and P2' fail to become a sufficiently OFF status when the clock signal CK becomes HIGH.

According to the invention, there is provided a latch circuit having a voltage level converting function, comprising:

voltage level converting means for converting the voltage level of an input signal and for releasing an output signal with a voltage level different from the voltage level of the input signal; and mode changing means responsive to a control signal to change the voltage level converting means between two modes one of which is for permitting the input signal to pass through and be dealt as an output signal and the other of which is for holding the input signal upon a change of the control signal and for dealing it as an output signal.

According to the invention, there is further provided a flip-flop circuit having a voltage level converting function, comprising:

a master latch circuit supplied with an input data signal and a control signal, and responsive to the control signal to change between two modes one of which is a pass-through mode for permitting the input data signal to pass through and be dealt as an intermediate output signal and the other of which is a holding mode for holding the input data signal upon a change of the control signal and dealing it as an intermediate output signal; and a slave latch circuit supplied with the intermediate output signal and the control signal, and responsive to the control signal, the slave latch circuit taking a pass-through mode permitting the intermediate output signal to pass therethrough and be dealt as an output data signal when the master latch circuit is in the holding mode, the slave latch circuit taking a holding mode for holding the intermediate output signal upon a change of the control signal and dealing it as an output data signal when the master latch circuit is in the pass-through mode, and the slave latch circuit converting the voltage level of the intermediate output signal and releasing it as the output data signal with a voltage level different from the voltage level of the intermediate output signal.

According to the invention, there is further provided a latch circuit having a voltage level converting function comprising:

a latch circuit operative with a first voltage, the latch circuit holding a HIGH level or a LOW level of an input signal applied upon a rising of the clock signal while a supplied clock signal is HIGH, and dealing it as an output signal, the latch circuit releasing an output signal of a HIGH level regardless of the input signal while the clock signal is LOW; and a voltage level converting circuit located in a stage former than entry of the clock signal to the latch circuit, the voltage level converting circuit raising the voltage level of the clock signal introduced with a second voltage lower than the first voltage and thereafter supplying as a clock signal with the first voltage to the latch circuit.

According to the invention, there is further provided a flip-flop circuit having a voltage level converting function, comprising:

a master latch circuit operative with a first voltage, the master latch circuit holding a HIGH level or a LOW level of an input signal applied upon a rising of the clock signal while a supplied clock signal is HIGH, and dealing it as an output signal, the master latch circuit releasing an output signal of a HIGH level regardless of the input signal while the clock signal is LOW;

a voltage level converting circuit located in a stage former than entrance of the clock signal to the latch circuit, the voltage level converting circuit raising the voltage level of the clock signal introduced with a second voltage lower than the first voltage and thereafter supplying as a clock signal with the first voltage to the master latch circuit; and a slave latch circuit operative in responsive to the output signal from the master latch circuit to release an output data signal with the first voltage.

DETAILED DESCRIPTION OF THE PREFERRED EMBODIMENTS (First Embodiment)

The first embodiment of the invention is directed to reducing circuit elements to decrease the power consumption and to increase the operation speed by incorporating voltage level converter circuits into a slave latch circuit in a master slave type flip-flop circuit. It is explained below in greater detail.

Figure 1:
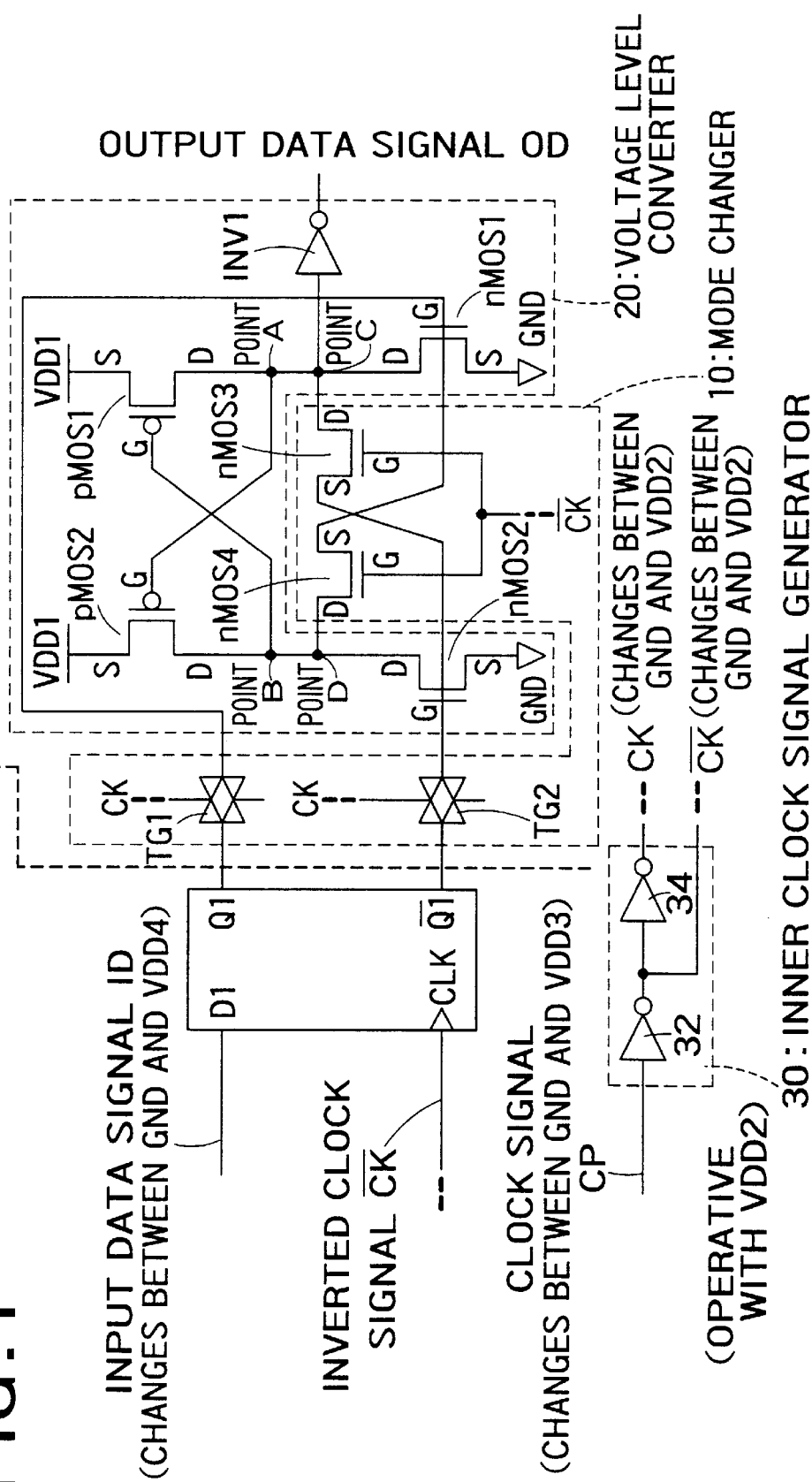
FIG. 1 is a diagram of a voltage level converting flip-flop circuit according to the first embodiment of the invention.

FIG. 1 is a diagram showing a voltage level converting flip-flop circuit according to the first embodiment of the invention.

As shown in FIG. 1, the voltage level converting flip-flop circuit according to the first embodiment includes a master latch circuit ML and a slave latch circuit SL.

the master latch circuit ML is an ordinary-type latch circuit including a data input terminal D1 for introducing an input data signal ID, clock input terminal CLK for introducing an inverted clock signal/CK, data output terminal Q1 for outputting data, and inverted data output terminal/Q1 for outputting data in an inverted form.

Data output signal from the data output terminal Q1 and the inverted data output terminal/Q1 can be regarded as intermediate output signals to the slave latch circuit SL when viewed from the entire flip-flop.

When the input from the clock input terminal CLK is HIGH, the master latch circuit ML functions to pass the input data signal ID therethrough to be as an intermediate output signal. When the input from the clock input terminal CLK is LOW, the master latch circuit ML functions to hold the state of the input data signal ID upon the change to the LOW level as an intermediate output signal. In the embodiment shown here, since an inverted clock signal/CK is input to the clock input terminal CLK, when the clock signal CK is LOW, the master latch circuit ML functions to permit the input data signal ID to pass and become the intermediate output signal when the clock signal CK is LOW; and when the clock signal CK is HIGH, the master latch circuit ML functions to hold the status as an intermediate output signal.

The master latch circuit ML is configured to operate with a voltage VDD2 lower than a voltage VDD1 for activating the slave latch circuit SL which will be explained later. The clock signal CK changes between the ground level and a voltage VDD2, and the input data signal ID changes between the ground level and a voltage VDD4. The clock signal CK changing between the ground level and the voltage VDD2 is output from an inner clock signal generator 30 operative with the voltage VDD2. That is, it is produced by making a clock signal CP changing between the ground level and a voltage VDD3 to pass through inverters 32 and 34 operative with the voltage VDD2. These voltages VDD3 and VDD4 are equal to or higher than the voltage VDD2. That is, voltages VDD3 and VDD4 are not lower than the voltage VDD2. Additionally, these voltages VDD3 and VDD4 are lower than the voltage VDD1. Thus, these voltages are related as follows.

VDD1>VDD3, VDD4≧VDD2

Voltage VDD3 and voltage VDD4 may be equal or different. Moreover, voltage VDD3 and voltage VDD4 may be higher than voltage VDD1. It is sufficient that voltage VDD3 and voltage VDD4 becomes equal to or higher than voltage VDD2 so as to prevent a leak current in the inverter 32 and the master latch circuit ML.

The slave latch circuit SL includes a mode changer 10 and a voltage level converter 20. More specifically, the data output terminal Q1 in the master latch circuit ML is connected to a transmission gate TG1. The inverted data output terminal/Q1 in the master latch circuit ML is connected to a transmission gate TG2. These transmission gates TG1 and TG2 are gate circuits for transmitting or blocking the intermediate output signal from the master latch circuit ML in response to the clock signal CK. That is, they pass the signal when the clock signal CK is HIGH, and block the signal when the clock signal CK is LOW. These transmission gates TG1 and TG2 are controlled by the clock signal CK and the inverted clock signal/CK changing within the voltage VDD2 similarly to the master latch circuit ML.

The transmission gate TG1 is connected to an n-type MOS transistor nMOS1. The drain D of the n-type MOS transistor nMOS1 is connected to the drain D of a p-type MOS transistor pMOS1 located in an upper side in the drawing. The source S of the p-type MOS transistor pMOS1 is connected to the power source of voltage VDD1. As explained above, voltage VDD1 is higher than voltage VDD2 used for the master latch circuit ML. The source S of the n-type MOS transistor nMOS1 is connected to ground.

The transmission gate TG2 is connected to an n-type MOS transistor nMOS2. The drain D of the n-type MOS transistor nMOS2 is connected to the drain D of a p-type MOS transistor pMOS2 located in an upper position in the drawing. The source S of the p-type MOS transistor pMOS2 is connected to the power source of voltage VDD1. The source S of the n-type MOS transistor nMOS2 is connected to ground.

Point A between the p-type MOS transistor pMOS1 and n-type MOS transistor nMOS1 is connected to the gate G of the p-type MOS transistor pMOS2. Point B between the p-type MOS transistor pMOS2 and the n-type MOS transistor nMOS2 is connected to the gate G of the p-type MOS transistor pMOS1. Point C between point A and the n-type MOS transistor nMOS1 is connected to the gate G of the n-type MOS transistor nMOS2 via an n-type MOS transistor nMOS3. Point D between point B and the n-type MOS transistor nMOS2 is connected to the gate G of the n-type MOS transistor nMOS1 via an n-type MOS transistor nMOS4. Connected to the gates G of these n-type MOS transistors nMOS3 and nMOS4 is the inverted clock signal/CK. The above-mentioned pont C is connected also to the inverter INV1, and an output from the inverter INV1 is output as the output data signal OD from the slave latch circuit SL. The output data signal OD is just the output of the voltage level converting flip-flop circuit. That is, an output terminal for the output data signal OD is provided in a location beyond the inverter INV1.

Among these elements, transmission gates TG1, TG2, and n-type MOS transistors nMOS3 and nMOS4 form the mode changer 10. the n-type MOS transistors nMOS1, nMOS2, p-type MOS transistors pMOS1, pMOS2 and inverter INV1 form the voltage level converter 20. The voltage level converter 20 operates with voltage VDD1 as explained before.

Next explained are behaviors of the voltage level converting flip-flop circuit shown in FIG. 1.

First explained are solo behaviors of the slave latch circuit SL. At first, the clock signal CK is HIGH. When the clock signal CK is HIGH, both transmission gates TG1 and TG2 become conductive. Since the inverted clock signal/CK is currently LOW, both nMOS3 and nMOS4 become OFF. Therefore, the voltage level converting flip-flop circuit of FIG. 1 under the clock signal CK being HIGH is equivalent to the circuit shown in FIG. 2.

Figure 2:
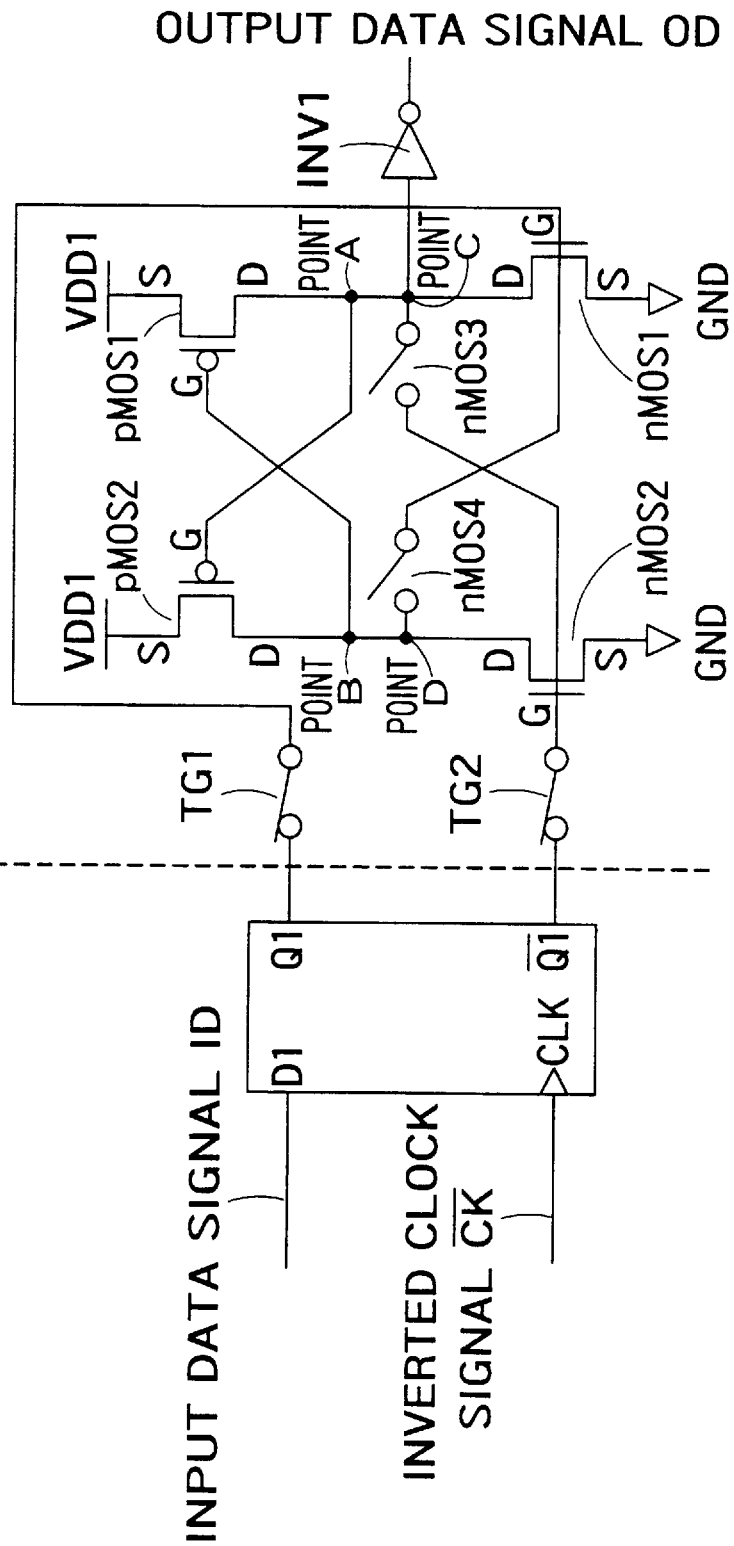
FIG. 2 is an equivalent circuit diagram of the voltage level converting flip-flop circuit of FIG. 1 in a status with a clock signal being HIGH.

As shown in FIG. 2, when the clock signal CK is HIGH, the slave latch circuit SL raises the voltage level of the intermediate output signal from the data output terminal Q1 in the master latch circuit ML, and lets it pass through as it is. That is, when the intermediate output signal from the data output terminal Q1 is HIGH, the voltage of the signal is VDD2. Therefore, the slave latch circuit SL converts the voltage VDD2 into VDD1 higher than VDD2, and releases the output data signal OD as a HIGH signal. On the other hand, when the intermediate output signal of the data output terminal Q1 is LOW, the voltage of the signal is the ground level. Therefore, the slave latch circuit SL releases the ground voltage directly as the output data signal OD. This is explained below in greater detail.

Assume here that the intermediate output signal from the data output terminal Q1 in the master latch circuit ML is LOW and the intermediate output signal from the inverted data output terminal/Q1 is HIGH. Then, the n-type MOS transistor nMOS1 becomes OFF, and the n-type MOS transistor nMOS2 becomes ON. Since the n-type MOS transistor nMOS2 is ON, the voltage at point B becomes the ground level. Therefore, the voltage at the gate G of the p-type MOS transistor pMOS1 also becomes the ground level, and the p-type MOS transistor pMOS1 is turned ON. Since the n-type MOS transistor nMOS1 is OFF at the moment, point A exhibits voltage VDD1. Since point A is voltage VDD1, the gate G of the p-type MOS transistor pMOS2 also becomes voltage VDD1, and the p-type MOS transistor pMOS2 is turned OFF.

Additionally, since point C becomes voltage VDD1 as well, the output of the inverter INV1 becomes the ground level.

In contrast, assume that the output from the data output terminal Q1 in the master latch circuit ML is HIGH and the output from the inverted data output terminal/Q1 is LOW. In this case, the n-type MOS transistor nMOS1 becomes ON, and the n-type MOS transistor nMOS2 becomes OFF. Since the n-type MOS transistor nMOS1 is ON, the voltage at point A becomes the ground level. Therefore, also the voltage at the gate G of the p-type MOS transistor pMOS2 becomes the ground level, the p-type MOS transistor pMOS2 is turned ON. Since the n-type MOS transistor nMOS2 is OFF here, point B exhibits voltage VDD1. Since point B becomes voltage VDD1, also the gate G of the p-type MOS transistor pMOS1 becomes voltage VDD1, and the p-type MOS transistor pMOS1 is turned OFF. Like the point A, also the point C exhibits the ground level voltage, and the output of the inverter INV1 becomes voltage VDD1. The voltage VDD1 is higher than voltage VDD2. Therefore, it is known that the intermediate output signal of voltage VDD1 output from the master latch circuit ML has been converted into a high voltage and output.

The above explanation has been made on solo behaviors of the slave latch circuit SL during the clock signal CK being HIGH. Next explained solo behaviors of the slave latch circuit SL during the clock signal CK being LOW.

As shown in FIG. 1, when the clock signal CK is LOW, both transmission gates TG1 and TG2 are in blocking conditions. Since the inverted clock signal/CK is HIGH, both n-type MOS transistors nMOS3 and nMOS4 becomes ON. Therefore, the voltage level converting flip-flop circuit of FIG. 1 during the clock signal CK being LOW is equivalent to the circuit shown in FIG. 3.

Figure 3:
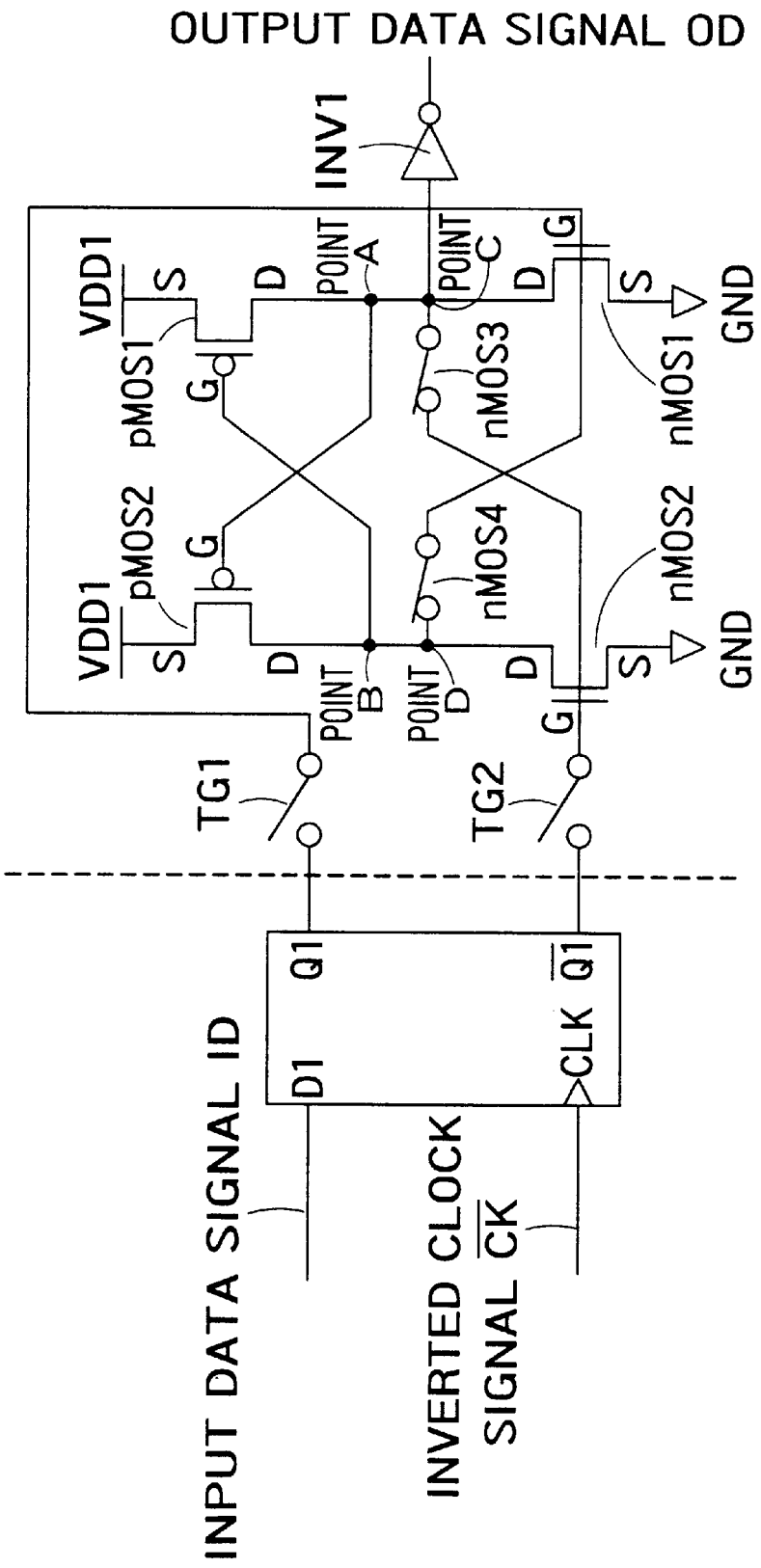
FIG. 3 is an equivalent circuit diagram of the voltage level converting flip-flop circuit of FIG. 1 in a status with the clock signal being LOW.

It is known from FIG. 3 that the slave latch circuit SL holds the output data signal OD at the moment when the clock signal CK changes from HIGH to LOW. That is, if the output data signal OD is HIGH when the clock signal CK changes to the LOW level, then the slave latch circuit SL maintains the HIGH state until the clock signal CK next changes to the HIGH level. In contrast, if the output data signal OD is LOW when the clock signal CK changes to the LOW level, the slave latch circuit SL maintains the LOW state until the clock signal CK next changes to the HIGH level. This is explained below in greater detail.

Assume that the output data signal OD was HIGH when the clock signal CK changed from HIGH to LOW. In this case, as an artisan will estimate from the above-explained behaviors upon the clock signal CK being HIGH, since the voltage at point C is the ground level, the voltage at the gate G of the n-type MOS transistor nMOS2 becomes the ground level. Therefore, the n-type MOS transistor nMOS2 is maintained in the OFF state. Additionally, since the voltage at point A is also the ground level, the p-type MOS transistor pMOS2 remains in the ON state. Since the p-type MOS transistor pMOS2 is ON and the n-type MOS transistor nMOS2 is OFF, voltage VDD1 at point B and pont D is maintained. Since point B is voltage VDD1, the gate G of the p-type MOS transistor pMOS1 also becomes voltage VDD1, and the p-type MOS transistor pMOS1 remains OFF. Since point D is voltage VDD1, the n-type MOS transistor nMOS1 remains ON. Strictly speaking, the voltage of the gate G of the n-type MOS transistor nMOS1 is a potential lower than the voltage VDD1 by the threshold voltage of the n-type MOS transistor nMOS4; however, this value of the gate voltage is sufficient to maintain the n-type MOS transistor nMOS1 in the ON state. Since the n-type MOS transistor nMOS1 is maintained ON and the p-type MOS transistor pMOS1 is maintained OFF, the ground voltage at point C is also maintained. Therefore, it results in maintaining the HIGH state of the output data signal OD.

In contrast, assume that output data signal OD was LOW when the clock signal CK changed from HIGH to LOW. In this case, as an artisan will estimate from the above-explained behaviors upon the clock signal CK being HIGH, since pont C is voltage VDD1, the gate G of the n-type MOS transistor nMOS2 becomes voltage VDD1. Therefore, the n-type MOS transistor nMOS2 is maintained ON. Strictly, the voltage at the gate G of the n-type MOS transistor nMOS2 is a voltage lower than the voltage VDD1 by the threshold voltage of the n-type MOS transistor nMOS3; however, this value of the gate voltage is sufficient to maintain the n-type MOS transistor nMOS2 ON. Additionally, since point A is also the voltage VDD1, the p-type MOS transistor pMOS2 remains OFF. Since the p-type MOS transistor pMOS2 is OFF and the n-type MOS transistor nMOS2 is ON, the ground voltage at point B and pont D is also maintained. Since the voltage at point B is the ground level, the voltage of the gate G of the p-type MOS transistor pMOS1 also becomes the ground level, and the p-type MOS transistor pMOS1 remains ON. Additionally, since the voltage at point D is the ground level, the n-type MOS transistor nMOS1 is maintained OFF. Since the n-type MOS transistor nMOS1 is maintained OFF and the p-type MOS transistor pMOS1 is maintained ON in this manner, voltage VDD1 at point C is also maintained. Therefore, the LOW state of the output data signal OD is maintained.

Figure 4:
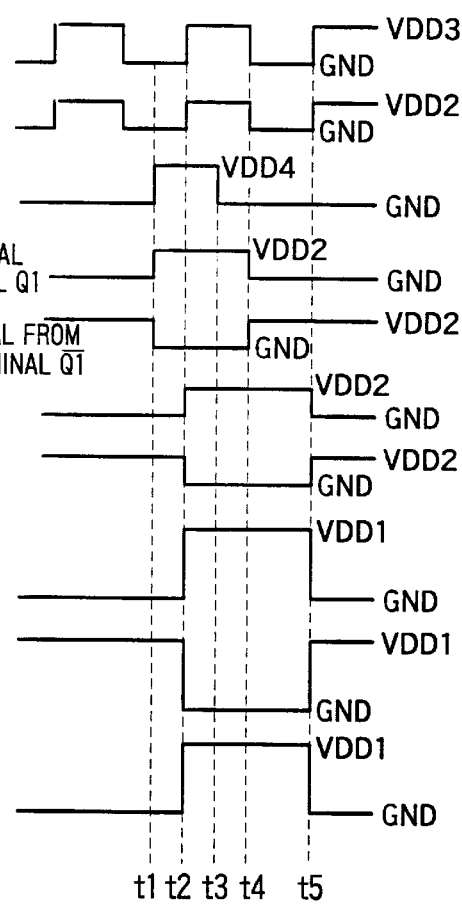
FIGS. 4A–4(J) are timing charts of signals and voltages at various portions in the voltage level converting flip-flop circuit of FIG. 1.

Heretofore, solo behaviors of the slave latch circuit SL. Next explained are whole behaviors of the voltage level converting flip-flop circuit with reference to FIG. 4 which is a timing chart of signals and voltage at different portions of the voltage level converting flip-flop circuit. Shown at (a) of FIG. 4 is an aspect of the clock signal CP which changes between the ground level and the voltage VDD3. Shown at (b) of FIG. 4 is an aspect of the clock signal CK which changes between the ground level and the voltage VDD2. Shown at (c) of FIG. 4 is an aspect of the input data signal ID which changes between the ground level and the voltage VDD4. Shown at (d) and (e) of FIG. 4 are aspects of the intermediate output signal from the data output terminal Q1 and the intermediate output signal from the inverted data output terminal/Q1, shown at (f) and (g) of FIG. 4 are aspects of voltages at gates G of nMOS1 and nMOS2, which all change between the ground level and the voltage VDD2. Shown at (h) and (i) of FIG. 4 are aspects of voltages at point B and point A, and shown at (j) of FIG. 4 is an aspect of the output data signal OD, which all change between the ground level and the voltage VDD1.

As an artisan will estimate from FIG. 4 and FIG. 1, the clock signal CK and the inverted clock signal/CK are introduced into the transmission gates TG1, TG2 and the clock input terminal CLK of the master latch circuit ML. The inverted clock signal/CK is input to the n-type MOS transistors nMOS3 and nMOS4.

Assume here that the input data signal ID introduced into the data input terminal D1 of the master latch circuit ML changed from LOW to HIGH at time t1 as shown at (c) of FIG. 4 while the clock signal CK was input. At time t1, since the clock signal CK is LOW as shown at (b) of FIG. 4, the HIGH level signal as the input data signal ID is output from the data output terminal Q1 as shown at (d) of FIG. 4. As shown at (e) of FIG. 4, since the LOW level signal inverted from the above-mentioned signal is output from the inverted data output terminal/Q1. However, as shown at (b) of FIG. 4, since the clock signal CK still remains LOW, both transmission gates TG1 and TG2 are in blocking conditions. Therefore, as shown at (f) and (g) of FIG. 4, the voltage at the gate G of the n-type MOS transistor nMOS1 remains LOW, and the voltage at the gate G of the n-type MOS transistor nMOS2 remains HIGH.

As shown at (b) of FIG. 4, when the clock signal CK changes from LOW to HIGH at time t2, both transmission gates TG1 and TG2 of FIG. 1 become conductive. Therefore, as shown at (f) of FIG. 4, the voltage at the gate G of the n-type MOS transistor nMOS1 becomes HIGH, and the voltage at the gate G of the n-type MOS transistor nMOS2 becomes LOW as shown at (g) of FIG. 4. Therefore, as shown at (h) of FIG. 4, the potential at point B of the slave latch circuit SL changes from LOW to HIGH, and as shown at (i) of FIG. 4, the potential at point A of the slave latch circuit SL changes from HIGH to LOW. As a result, as shown at (e) of FIG. 4, the output data signal OD changes from LOW to HIGH. Additionally, as apparent from comparison between (c) and (j) of FIG. 4, the voltage has been converted into voltage VDD1 higher than voltage VDD4.

Next assume that the input data signal ID changed from HIGH to LOW at time t3 as shown at (c) of FIG. 4. However, since the clock signal CK then exhibits the HIGH level as shown at (b) of FIG. 4, the output from the data output terminal Q1 remains HIGH as shown at (d) of FIG. 4 by the holding function of the master latch circuit ML. The output from the inverted data output terminal/Q1 is maintained LOW as shown at (e) of FIG. 4.

The clock signal next changes from HIGH to LOW at time t4 as shown at (b) of FIG. 4. Then, as shown at (c) of FIG. 4, since the input data signal ID remains LOW, the output of the data output terminal Q1 changes from HIGH to LOW as shown at (d) of FIG. 4. Additionally, as shown t (e) of FIG. 4, the output from the inverted data signal output terminal/Q1 changes from LOW to HIGH. However, since the inverted clock signal/CK is HIGH, transmission gates TG1 and TG2 are turned OFF, the mode changer 10 of the slave latch circuit SL is changed to the holding condition, and maintains the status having appeared when the clock signal CK changed. That is, as shown at (h) and (i) of FIG. 4, point B is maintained HIGH, and point A is maintained LOW. Therefore, the output data signal OD is also maintained HIGH.

The clock signal CK next changes from LOW to HIGH at time t5 as shown at (b) of FIG. 4. As a result, transmission gates TG1 and TG2 both become ON. Therefore, as shown at (f) and (g) of FIG. 4, the potential at the gate G of the n-type MOS transistor nMOS1 becomes LOW, and the potential at the gate G of he n-type MOS transistor nMOS2 becomes HIGH. As a result, the potential at point B changes from HIGH to LOW, and the potential at point A changes from LOW to HIGH. That is, the mode changer 10 changes to the conductive status, and the output data signal OD changes from HIGH to LOW.

As explained above, since the voltage level converting flip-flop circuit according to the embodiment includes the voltage level converter circuit 20 in the slave latch circuit SL as shown in FIG. 1, the number of transistors can be reduced. That is, since no voltage level converter is required independently from the master slave type flip-flop like the conventional one, the number of transistors can be reduced.

In other words, since the latch function can be realized only by adding two transistors, namely, n-type MOS transistors nMOS3 and nMOS4, to the voltage level converter circuit 20, the number of transistors can be reduced. Because the number of transistors can be reduced in this manner, the entire circuit area can be reduced, and the entire operation speed is increased.

Moreover, since the circuits other than the voltage level converter circuit 20 can be activated by voltages VDD2, VDD3 and VDD4 lower than voltage VDD1, the power consumption can be reduced. That is, since the master latch circuit ML is operative with voltage VDD2 lower than voltage VDD1, its power consumption can be reduced. Additionally, it is also possible to decrease voltages of the clock signal CP and the input data signal ID. That is, by changing the clock signal CO between the ground level and voltage VDD3 and changing the input data signal ID between the ground level and voltage VDD4 and by setting these voltages VDD3 and VDD4 lower than voltage VDD1, the power consumption can be reduced.

Figure 5:
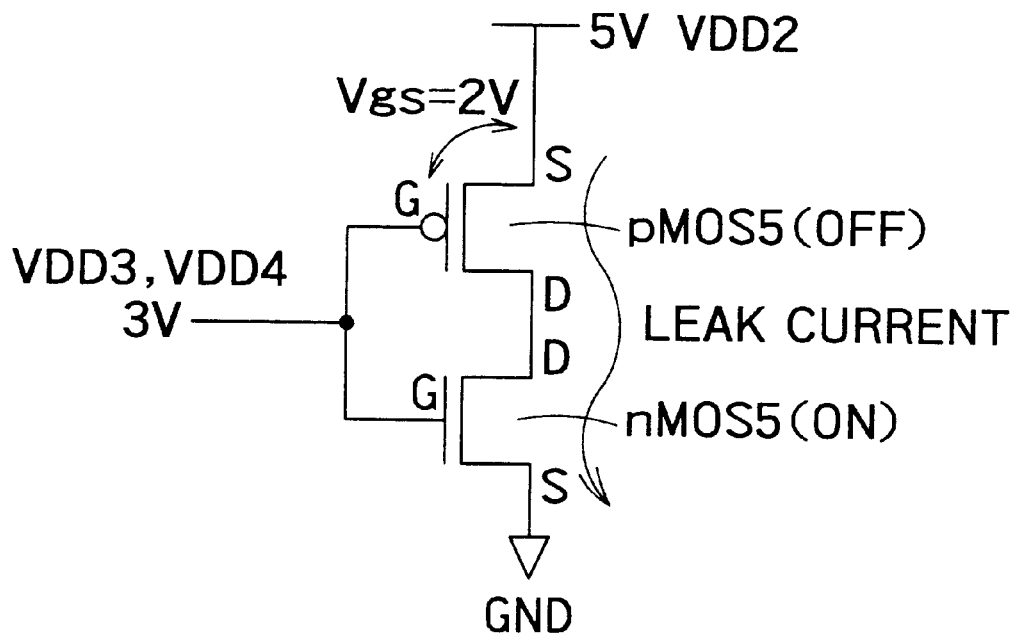
FIG. 5 is a diagram explaining a status where MOS transistors fail to be completely OFF and leave a leak current to flow.
Figure 6:
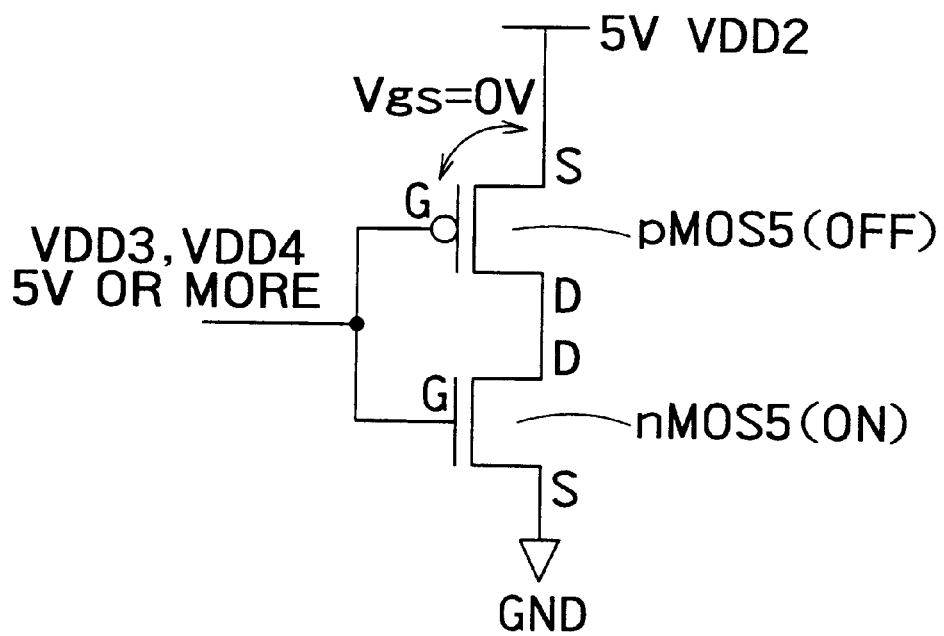
FIG. 6 is a diagram explaining a status where MOS transistors become completely OFF and prevent the leak current.

Furthermore, since the voltages VDD3 and VDD4 are set equal to or lower than the voltage VDD2, the circuit can be activated for the flip-flop operation without a stationary leak current in the master latch circuit ML. That is, as understood from FIG. 5, for example, when a p-type MOS transistor pMOS5 and an n-type MOS transistor nMOS5 are connected in series, if voltages VDD3 and VDD4 are lower than voltage VDD2, there arises the problem that the p-type MOS transistor pMOS3 fails to be completely OFF because the potential difference Vgs between the gate and the source of the p-type MOS transistor pMOS5 becomes smaller than the threshold voltage. Therefore, the p-type MOS transistor pMOS5 does not become completely OFF and causes a leak current to flow. However, as understood from FIG. 6, when the voltages VDD3 and VDD4 are higher than or equal to the voltage VDD2, the potential difference Vgs between the gate and the source is held not higher than the threshold voltage, and leak current can be prevented.

(Second Embodiment)

The second embodiment of the invention is directed to a modified version of the voltage level converting flip-flop circuit according to the first embodiment. More specifically, the master latch circuit ML is modified to have the data output terminal Q1 alone as its output terminal, and the slave latch circuit SL is structurally simplified.

Figure 7:
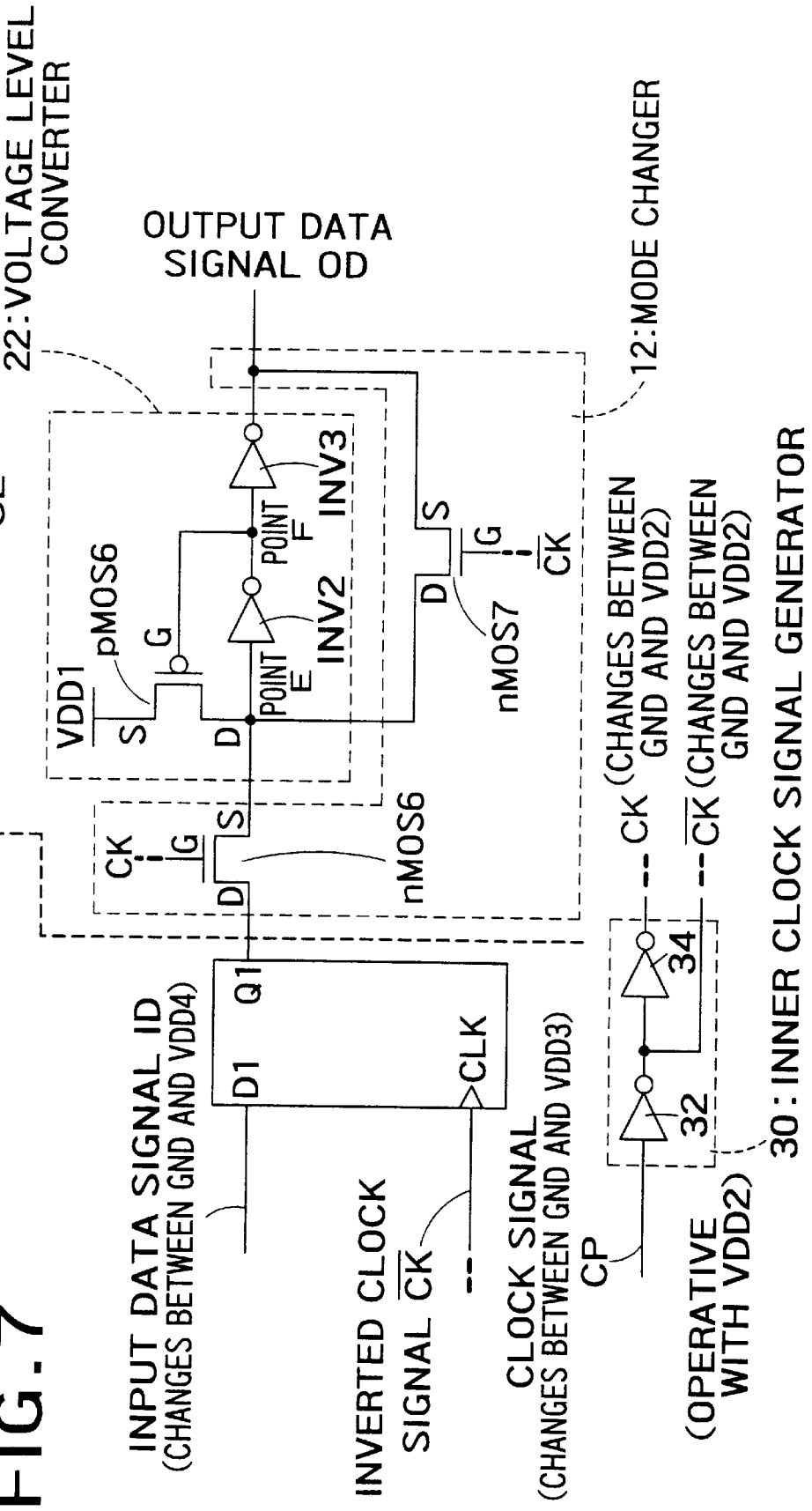
FIG. 7 is a diagram showing a voltage level converting flip-flop circuit according to the second embodiment of the invention.

FIG. 7 is a diagram showing the voltage level converting flip-flop circuit according to the second embodiment.

As shown in FIG. 7, the master latch circuit ML has only the data output terminal Q1 as its output terminal, and the inverted data output terminal /Q1 is removed therefrom.

The slave latch circuit SL is the same as the first embodiment in including the mode changer 12 and the voltage level converter circuit 22, but it is different in structure. More specifically, the data output terminal Q1 is connected to the drain D of an n-type MOS transistor nMOS6. The clock signal CK is input to the gate G of the n-type MOS transistor nMOS6. The source S of the n-type MOS transistor nMOS6 is connected to an inverter INV2 which is connected to an inverter INV3. The output of the inverter INV3 is the output data signal OD which is the output of the slave latch circuit SL. Point E between the n-type MOS transistor nMOS6 and the inverter INV2 is connected to the drain D of a p-type MOS transistor pMOS6 located in an upper location in the drawing. The source S of the p-type MOS transistor pMOS6 is connected to the power source of voltage VDD1. The gate G of the p-type MOS transistor pMOS6 is connected to point F between the inverter INV2 and the inverter INV3. Point E and the output end of the inverter INV3 are connected to each other via an n-type MOS transistor nMOS7. The inverted clock signal /CK is introduced into the gate G of the n-type MOS transistor nMOS7.

In the other respects, the voltage level converting flip-flop circuit according to the second embodiment is the same as the first embodiment, and their detailed explanation is omitted here.

Next explained are behaviors of the voltage level converting flip-flop circuit according to the second embodiment.

First explained are solo behaviors of the slave latch circuit SL. At first, the clock signal CK is HIGH. When the clock signal CK is HIGH, the n-type MOS transistor nMOS6 becomes ON. Since the inverted clock signal /CK is LOW, the n-type MOS transistor nMOS7 turns OFF. Therefore, the voltage level converting flip-flop circuit of FIG. 7 under the clock signal CK being HIGH is equivalent to the circuit shown in FIG. 8.

Figure 8:
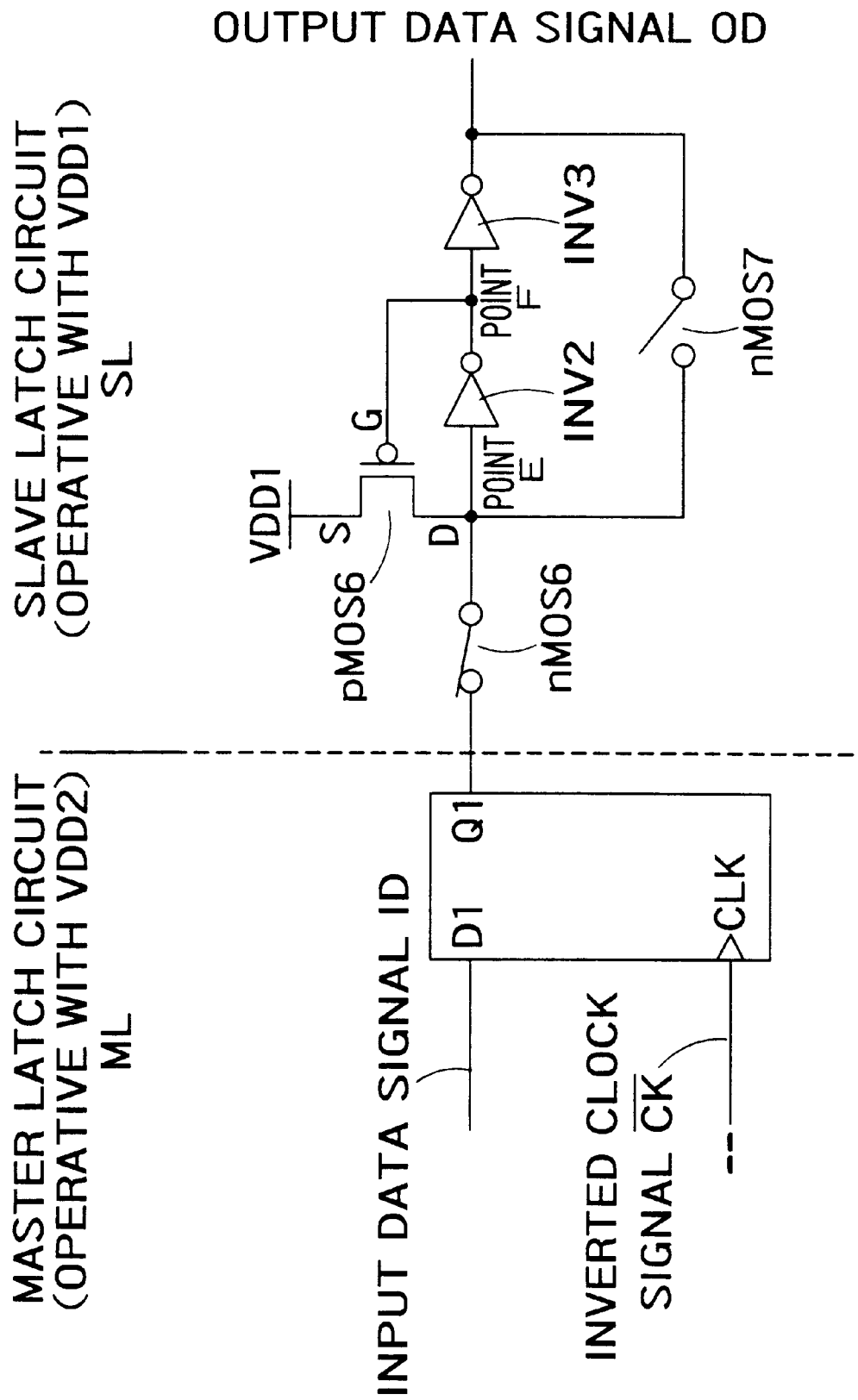
FIG. 8 is an equivalent circuit diagram of the voltage level converting flip-flop circuit of FIG. 7 in a status with a clock signal being HIGH.

As shown in FIG. 8, when the clock signal CK is HIGH, the slave latch circuit SL raises the voltage level of the intermediate output signal from the data output terminal Q1 in the master latch circuit ML, and lets it pass through as it is. That is, when the intermediate output signal from the data output terminal Q1 is HIGH, the voltage of the intermediate output signal is VDD2. The slave latch circuit SL converts the voltage VDD2 into VDD1 higher than VDD2, and releases the output data signal OD as a HIGH signal. On the other hand, when the intermediate output signal of the data output terminal Q1 is LOW, the voltage of the intermediate output signal is the ground level. Therefore, the slave latch circuit SL releases the ground voltage directly as the output data signal OD. This is explained below in greater detail.

Assume here that the intermediate output signal from the data output terminal Q1 in the master latch circuit ML is LOW. Then the output of the inverter INV2 is HIGH, and the output of the inverter INV3 is LOW. As a result, the output data signal OD becomes LOW. Accordingly, the gate G of the p-type MOS transistor pMOS6 becomes voltage VDD1. Therefore, the p-type MOS transistor pMOS6 turns OFF, and point E is maintained LOW.

In contrast, assume that the output from the data output terminal Q1 in the master latch circuit ML is HIGH. In this case, the output of the inverter INV2 becomes LOW, and the output of the inverter INV3 becomes HIGH. As a result, the output data signal OD becomes HIGH. The voltage of the output data signal OD is voltage VDD1 higher than VDD2 which is the voltage of he intermediate output signal from the data output terminal Q1. The voltage at point F on the output side of the inverter INV2 becomes the ground level. Therefore, the voltage of the gate G of the p-type MOS transistor pMOS6 also becomes the ground level. As a result, the p-type MOS transistor pMOS6 turns ON, and point E is held HIGH.

In a strict sense, the potential at point F does not become the ground level immediately after the intermediate output signal from the data output terminal Q1 changes HIGH because the intermediate output signal is voltage VDD2, and the potential at point E becomes VDD2-α lower than it by the threshold value voltage of the n-type MOS transistor nMOS6. VDD2-α is lower than the voltage VDD1. Therefore, the output of the inverter INV2 activated by voltage VDD1 fails to decrease to the ground level. However, the voltage not decreased to the ground level is also sufficient to turn the p-type MOS transistor pMOS6 ON. As a result, the p-type MOS transistor pMOS6 turns ON. When the p-type MOS transistor pMOS6 turns ON, point E becomes voltage VDD1. The, the output voltage of the inverter INV2 becomes the full ground level.

The above explanation has been made on solo behaviors of the slave latch circuit SL during the clock signal CK being HIGH. Next explained solo behaviors of the slave latch circuit SL during the clock signal CK being LOW.

As shown in FIG. 7, when the clock signal CK is LOW, the n-type MOS transistor nMOS6 turns OFF. Since the inverted clock signal/CK is HIGH, the n-type MOS transistor nMOS7 turns ON. Therefore, the voltage level converting flip-flop circuit of FIG. 7 during the clock signal CK being LOW is equivalent to the circuit shown in FIG. 9.

Figure 9:
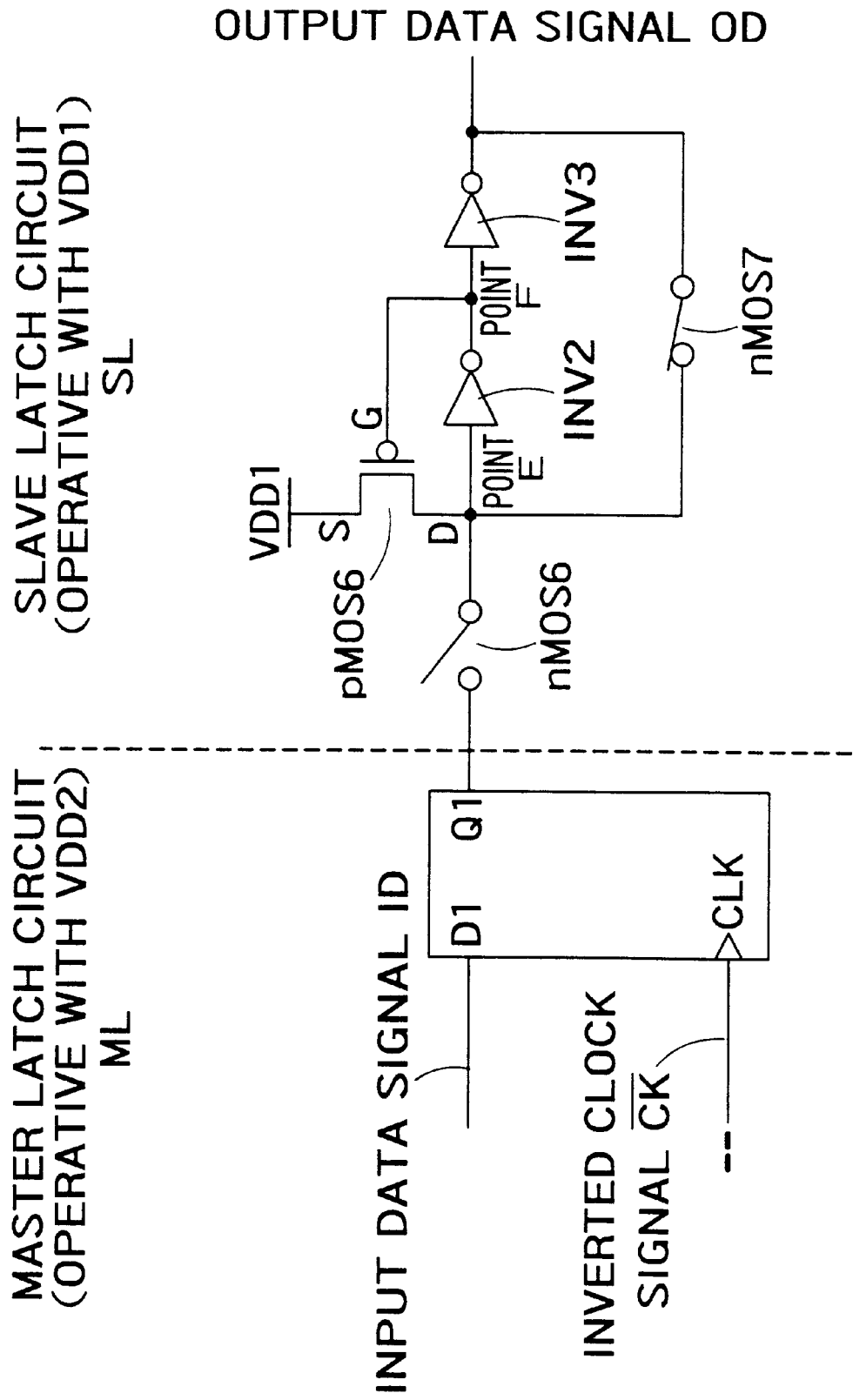
FIG. 9 is an equivalent circuit diagram of the voltage level converting flip-flop circuit of FIG. 7 in a status with a clock signal being LOW.

It is known from FIG. 9 that the slave latch circuit SL holds the output data signal OD at the moment when the clock signal CK changes from HIGH to LOW. That is, if the output data signal OD is HIGH when the clock signal CK changes to the LOW level, then the slave latch circuit SL maintains the HIGH state until the clock signal CK next changes to the HIGH level. In contrast, if the output data signal OD is LOW when the clock signal CK changes to the LOW level, the slave latch circuit SL maintains the LOW state until the clock signal CK next changes to the HIGH level. This is explained below in greater detail.

Assume that the output data signal OD was HIGH when the clock signal CK changed from HIGH to LOW. In this case, point E is held HIGH, and point F is held LOW. Therefore, the p-type MOS transistor pMOS6 is held ON, and point E remains HIGH with the voltage VDD1. Point F being LOW means that the output of the inverter INV3 is held HIGH.

Oppositely from this, assume that output data signal OD was LOW when the clock signal CK changed from HIGH to LOW. In this case, point E is held LOW, and point F is held HIGH. Therefore, the p-type MOS transistor pMOS6 is held OFF, and the voltage at point E remains the ground level. The point F being HIGH means that the output of the inverter INV3 remains LOW.

Figure 10:
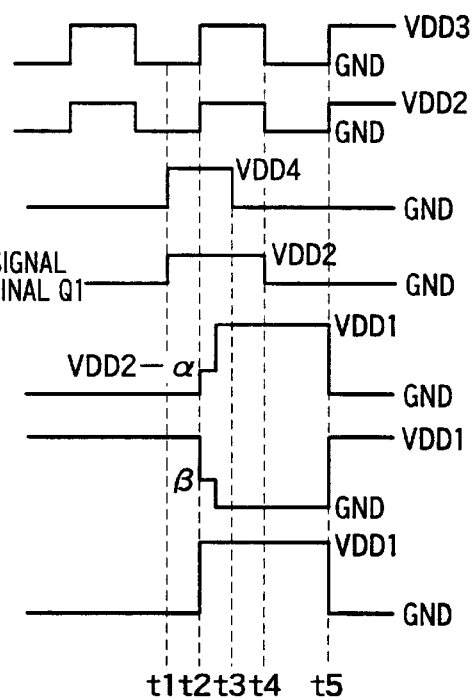
FIGS. 10A–10G are timing charts of signals and voltages at various portions in the voltage level converting flip-flop circuit of FIG. 7.

Heretofore, solo behaviors of the slave latch circuit SL. Next explained are whole behaviors of the voltage level converting flip-flop circuit with reference to FIG. 10 which is a timing chart of signals and voltage at different portions of the voltage level converting flip-flop circuit. Shown at (a) of FIG. 10 is an aspect of the clock signal CP which changes between the ground level and the voltage VDD3. Shown at (b) of FIG. 10 is an aspect of the clock signal CK which changes between the ground level and the voltage VDD2. Shown at (c) of FIG. 10 is an aspect of the input data signal ID which changes between the ground level and the voltage VDD4. Shown at (d) of FIG. 10 is an aspect of the intermediate output signal from the data output terminal Q1. Shown at (e) and (f) of FIG. 10 are aspects of voltages at point E and point F, and shown at (g) of FIG. 10 is an aspect of the output data signal OD, which all change between the ground level and voltage VDD1.

As an artisan will estimate from FIG. 10 and FIG. 7, the clock signal CK is introduced into the gate G of the n-type MOS transistor nMOS6. The inverted clock signal/CK is introduced into the gate G of the n-type MOS transistor nMOS7. The clock signal CK and the inverted clock signal/CK are introduced into the master latch circuit ML.

Assume here that the input data signal ID introduced into the data input terminal D1 of the master latch circuit ML changed from LOW to HIGH at time t1 as shown at (c) of FIG. 10 while the clock signal CK was input. At time t1, since the clock signal CK is LOW as shown at (b) of FIG. 10, the HIGH level signal as the input data signal ID is output from the data output terminal Q1 as shown at (d) of FIG. 10. However, since the clock signal CK still remains LOW as shown at (b) of FIG. 10, the n-type MOS transistor nMOS6 remains OFF. Therefore, as shown at (e) of FIG. 10, the voltage at point E remains LOW.

As shown at (b) of FIG. 10, when the clock signal CK changes from LOW to HIGH at time t2, the n-type MOS transistor of FIG. 7 turns ON. Therefore, as shown at (e) of FIG. 10, the voltage at point E becomes HIGH. However, as an artisan will estimate from the foregoing explanation, immediately after the n-type MOS transistor nMOS6 turns ON, the voltage at point E is VDD2-α which is no the fully HIGH level. Therefore, as shown at (f) of FIG. 10, also the potential at point F does not change to the ground level, but exhibits β. However, this voltage value at point F is sufficient to turn the p-type MOS transistor pMOS6 ON. As a result, the p-type MOS transistor pMOS6 turns ON, and the voltage at point E becomes voltage VDD1 after a delay as shown at (e) of FIG. 10, and the voltage at point F becomes the ground level after a delay as shown at (f) of FIG. 10.

Next assume that the input data signal ID changed from HIGH to LOW at time t3 as shown at (c) of FIG. 10. However, since the clock signal CK then exhibits the HIGH level as shown at (b) of FIG. 10, the intermediate output signal from the data output terminal Q1 is held HIGH as shown at (d) of FIG. 10 by the holding function of the master latch circuit ML.

The clock signal next changes from HIGH to LOW at time t4 as shown at (b) of FIG. 10, and the inverted clock signal/CK changes from LOW to HIGH. Then, as shown at (c) of FIG. 10, since the input data signal ID remains LOW, the intermediate output signal from the data output terminal Q1 changes from HIGH to LOW as shown at (d) of FIG. 10. However, since the inverted clock signal/CK is HIGH, the mode changer 12 of the slave latch circuit SL is changed to the holding condition, and maintains the status having appeared when the clock signal CK changed. That is, as shown at (e) through (g) of FIG. 10, the voltage at point E is maintained HIGH, and the voltage at point F is maintained LOW. Therefore, the output data signal OD is also maintained HIGH.

The clock signal CK next changes from LOW to HIGH at time t5 as shown at (b) in FIG. 10. Then, the n-type MOS transistor nMOS6 turns ON. Therefore, since the intermediate output signal from the data output terminal Q1 is LOW as shown at (d) of FIG. 10, the voltage at point E changes from HIGH to LOW as shown at (e) of FIG. 10. As a result, the voltage at point F changes from HIGH to LOW, and the output data signal OD changes from HIGH to LOW.

As explained above, since the voltage level converting flip-flop circuit according to the second embodiment locates the voltage level converter 22 in the slave latch circuit SL as shown in FIG. 7, it promises the same effects as those of the first embodiment. That is, since no voltage level converter is required independently from the master slave type flip-flop like the conventional one, the number of transistors can be reduced. In other words, since the mode changer can be realized only by adding the n-type MOS transistor nMOS7 to the voltage level converter circuit 20, the number of transistors can be reduced more than the first embodiment. Because of the reduction of transistors, the entire operation speed is increased. Additionally, since elements requiring the supply of the clock signal CK or the inverted clock signal/CK can be reduced to only to elements, namely, the n-type MOS transistors nMOS6 and nMOS7, in the slave latch circuit SL, the power consumption is decreased. Moreover, since the master latch circuit ML has only one data output terminal Q1, also the number of output terminals in the master latch circuit ML can be reduced. As a result, the entire circuit area can be reduced more.

Figure 17:
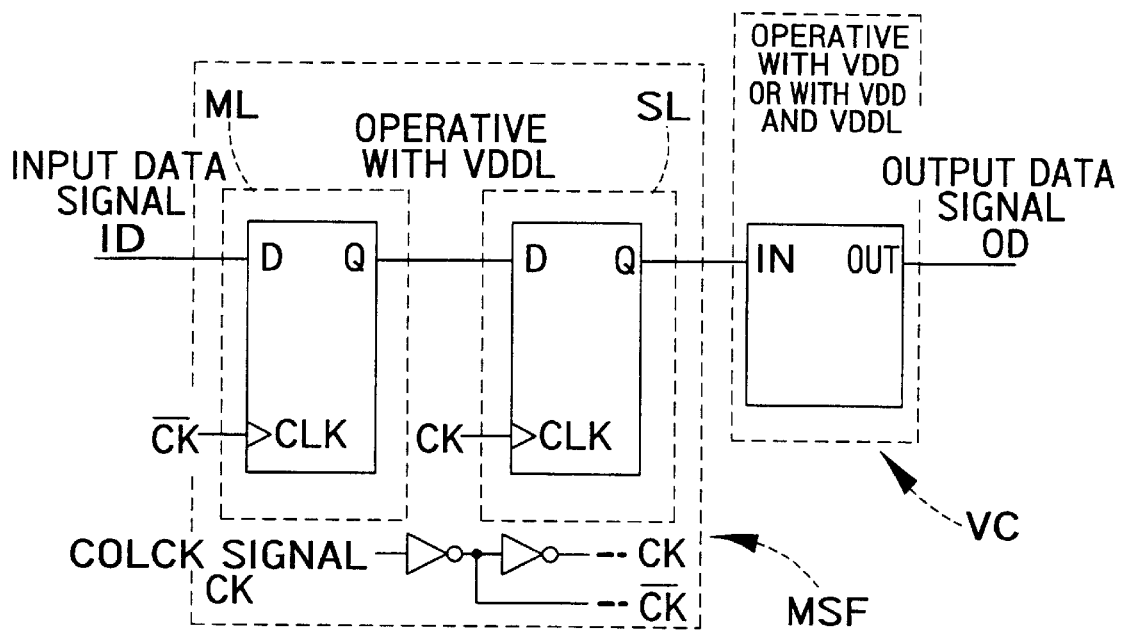
FIG. 17 is a diagram showing a further conventional flip-flop circuit having a voltage level converting function.
Figure 18:
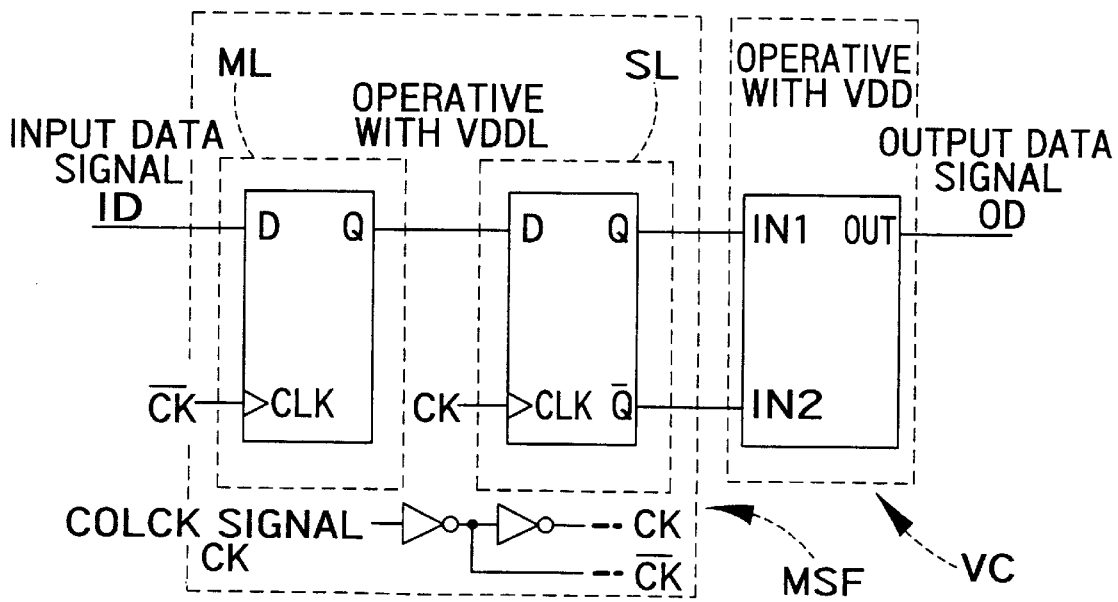
FIG. 18 is a still further conventional flip-flop circuit having a voltage level converting function.

Furthermore, since the voltage level converter circuit 22 is provided in the slave latch circuit SL as shown in FIG. 7 similarly to the first embodiment, the voltage level converting flip-flop circuit according to the second embodiment can be activated at a higher speed than the conventional flip-flop circuit shown in FIG. 17. That is, the embodiment increases the speed of the circuit both by increasing the operation voltage of the slave latch circuit SL and by decreasing the entire number of transistors.

Moreover, since the circuits other than the voltage level converter circuit 22 can be activated by voltages VDD2, VDD3 and VDD4 lower than voltage VDD1, the power consumption can be reduced similarly to the first embodiment. That is, since the master latch circuit ML is operative with voltage VDD2 lower than voltage VDD1, its power consumption can be reduced. Additionally, it is also possible to decrease voltages of the clock signal CP and the input data signal ID. That is, by changing the clock signal CP between the ground level and voltage VDD3 and changing the input data signal ID between the ground level and voltage VDD4 and by setting these voltages VDD3 and VDD4 lower than voltage VDD1, the power consumption can be reduced.

Figure 11:
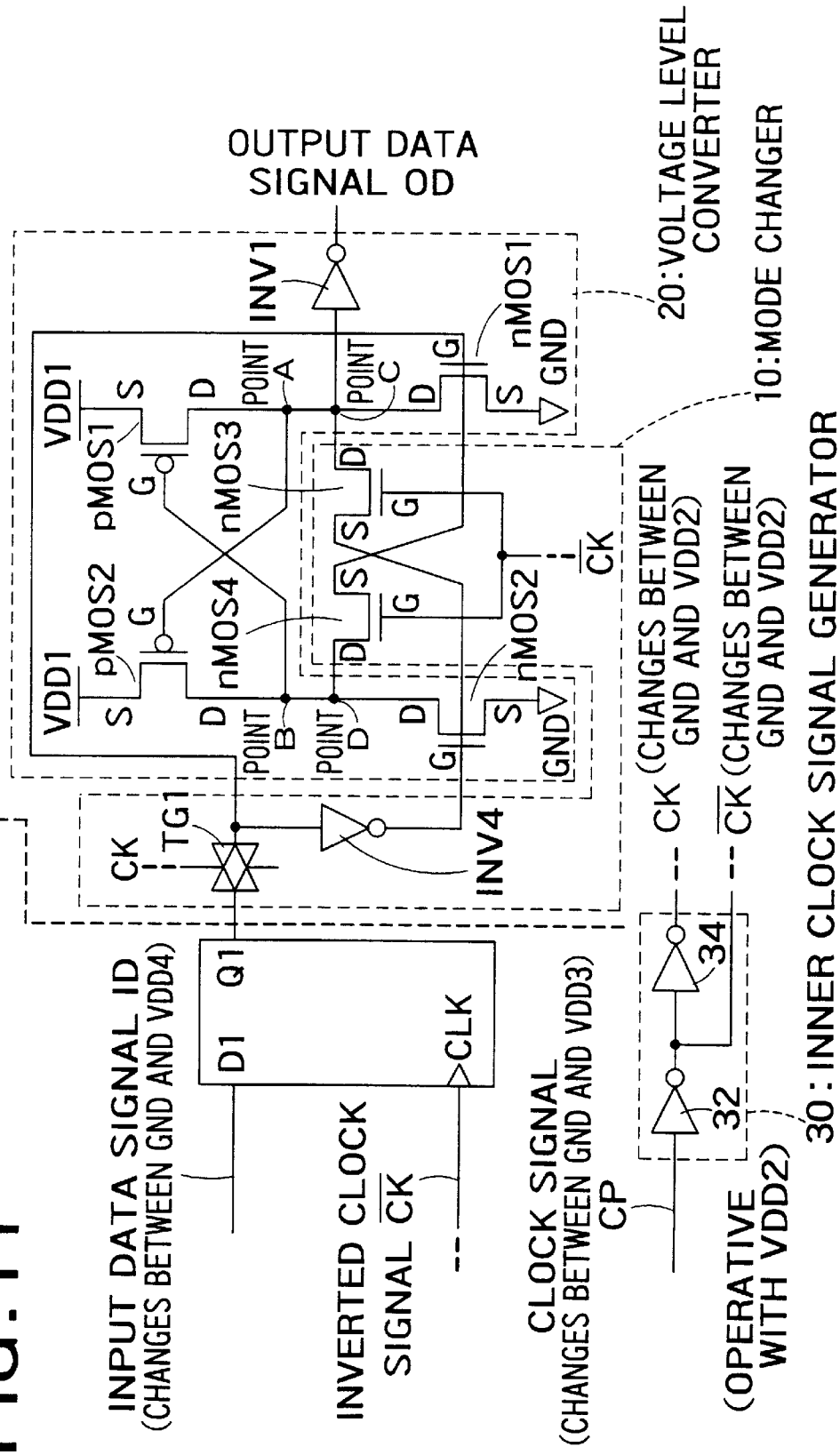
FIG. 11 is a diagram of a modified version of the voltage level converting flip-flop circuit shown in FIG. 1.

Furthermore, since the voltages VDD3 and VDD4 are set equal to or lower than the voltage VDD2, the circuit can be activated for the flip-flop operation without a stationary leak current in the master latch circuit ML. The invention is not limited to the first and second embodiments but can be changed or modified in various forms. For example, the circuit shown in FIG. 1 may be modified as shown in FIG. 11 by omitting the inverted data output terminal/Q1 from the master latch circuit ML. That is, the inverted data output terminal/Q1 can be omitted by connecting the transmission gate TG1 and the n-type MOS transistor nMOS2 via an inverter INV4.

Figure 12:
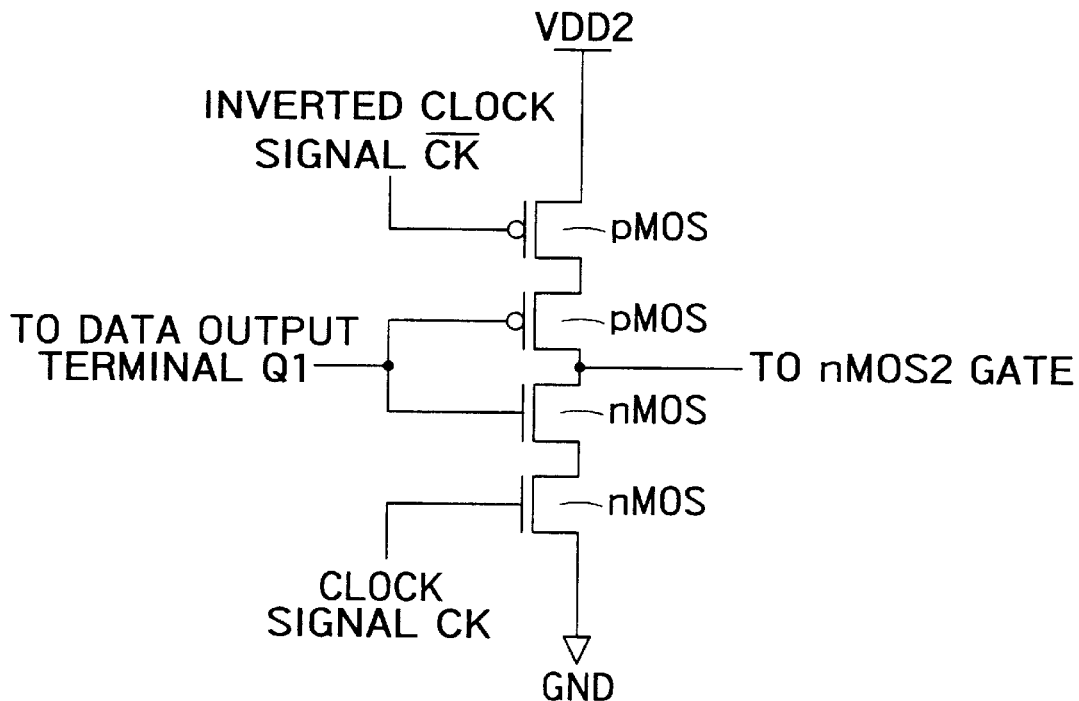
FIG. 12 is a diagram showing a clocked inverter modified as a gate circuit.
Figure 13:
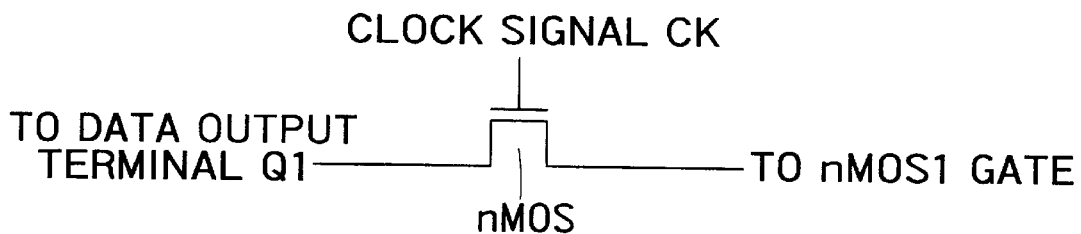
FIG. 13 is a diagram showing an n-type MOS transistor as a modification of a gate circuit.
Figure 14:
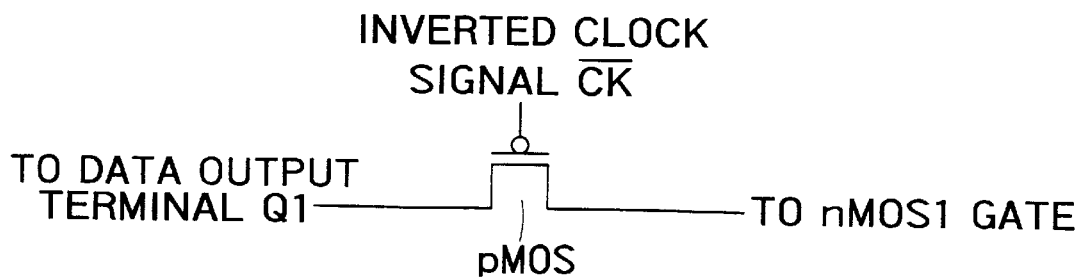
FIG. 14 is a diagram showing a p-type MOS transistor as a modification of a gate circuit.
Figure 15:
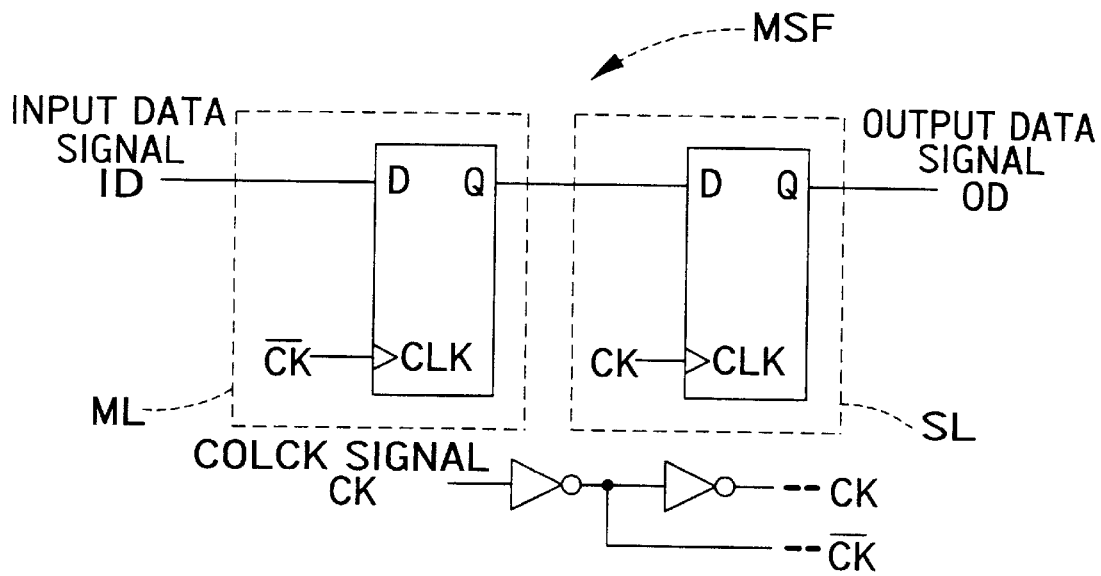
FIG. 15 is a diagram showing an ordinary master slave type flip-flop circuit.
Figure 16:
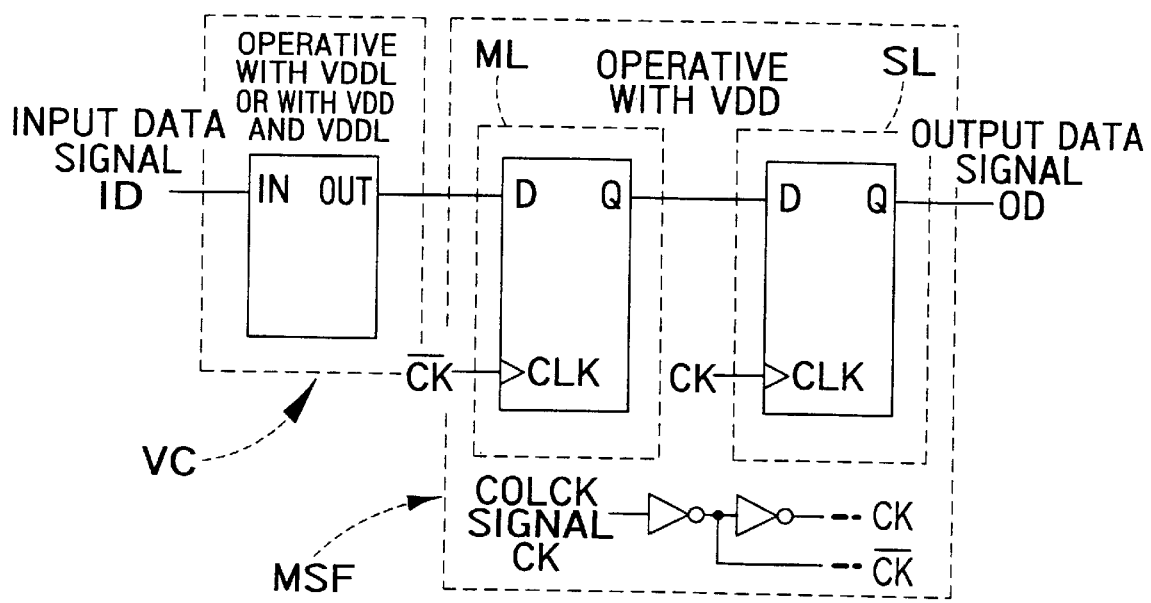
FIG. 16 is a conventional flip-flop circuit having a voltage level converting function.

The gate circuit may be made as using a clocked inverter as shown in FIG. 12. It is also possible to make it only of an n-type MOS transistor as shown in FIG. 13 or a p-type MOS transistor as shown in FIG. 14.

The relation among the voltage values VDD1 through VDD4 is not limited to the example suggested above. For example, by setting the voltage VDD1 for activating the slave latch circuit SL lower than the voltage VDD4 of the input data signal ID, the voltage level converting flip-flop circuit can be used as one of a type for converting a voltage level to a lower level.

Additionally, a plurality of signals different in amplitude from the input data signal ID and the clock signal CP can be used. For example, the clock signal CP may contain both a component with he amplitude from the ground level to the voltage VDD3 and a component with the amplitude from the ground level to the voltage VDD1. Similarly, the input data signal ID may contain both a component with the amplitude from the ground level to the voltage VDD4 and a component with the amplitude from the ground level to the voltage VDD1.

When the voltage VDD1, voltage VDD2 and voltage VDD4 are set equal to each other and the voltage VDD3 is set lower than them, the power for the clock system can be decreased.

(Third Embodiment)

The third embodiment of the invention is directed to promising that, when the clock signal is input to the flip-flop circuit including the master latch circuit and the slave latch circuit, the HIGH level voltage of the clock signal is set higher to fully turn off the MOS transistor used in the flip-flop circuit, so as to prevent a leak current and to minimize the power consumption. The embodiment is explained below in greater detail.

Figure 19:
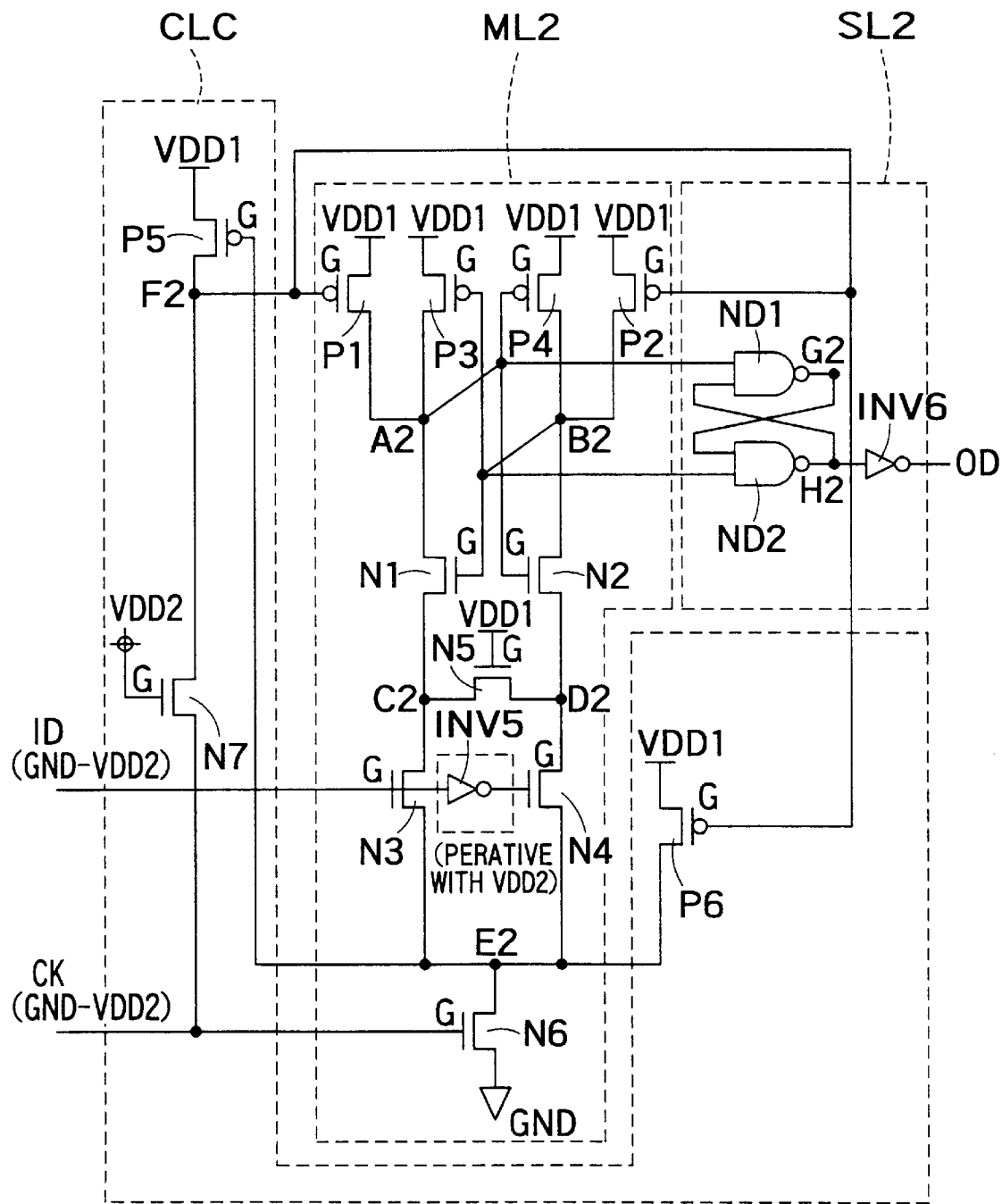
FIG. 19 is a voltage level converting flip-flop circuit according to the third embodiment of the invention.

FIG. 19 is a diagram showing a voltage level converting flip-flop according to the embodiment.

As shown in FIG. 19, the voltage level converting flip-flop circuit shown here includes a master latch circuit ML2, slave latch circuit SL2 and voltage level converter circuit CLC.

The master latch circuit ML2 includes p-type MOS transistors P1 through P4, n-type MOS transistors N1 through N6 and an inverter INV5. Above the ground terminal shown on a lower position in the drawing, the n-type MOS transistor N6 is provided. In a left side of the drawing between the power source of voltage VDD1 and the n-type MOS transistor N6, the p-type MOS transistor P3, n-type MOS transistor N1 and n-type MOS transistor N3 are connected in series. In a right side position in the drawing between the power source of voltage VDD1 and the n-type MOS transistor N6, the p-type MOS transistor P4, n-type MOS transistor N2 and n-type MOS transistor N4 are connected in series.

The p-type MOS transistor P1 is provided in parallel with the p-type MOS transistor P3. The p-type MOS transistor P2 is provided in parallel with the p-type MOS transistor P4. These p-type MOS transistors P1 and P2 are precharge transistors for setting nodes A2 and B2 always HIGH when the clock signal CK is LOW. The gate G of the p-type MOS transistor P4 and the gate G of the p-type MOS transistor P3 are commonly connected, and their midpoint is connected to the node A2 between the p-type MOS transistor P3 and the n-type MOS transistor N1. Similarly, the gate G of the p-type MOS transistor P3 and the gate G of the n-type MOS transistor N1 are commonly connected, and their midpoint is connected to a node B2 between the p-type MOS transistor P4 and the n-type MOS transistor N2.

A node C2 is provided between the n-type MOS transistor N1 and the n-type MOS transistor N3, and a node D2 is provided between the n-type MOS transistor N2 and the n-type MOS transistor N4. Connected between the nodes C2 and D2 is the n-type MOS transistor N5. Connected to the gate G of the n-type MOS transistor N5 is the power source of voltage VDD1. That is, the n-type MOS transistor N5 is a normally ON transistor.

An inverter INV5 is connected between the gate G of the n-type MOS transistor N3 and the gate G of the n-type MOS transistor N4. The inverter INV5 is activated with the voltage VDD2 lower than the voltage VDD1. The input data signal ID is introduced into the gate G of the n-type MOS transistor N3 whereas signal in the inverted form of the input data signal ID is introduced to the gate G of the n-type MOS transistor N4. Therefore, the n-type MOS transistor N3 and the n-type MOS transistor N4 are operative in a mutually complementary relation. The input data signal ID is a signal changing between the ground level and VDD2.

The slave latch circuit SL2 includes NAND circuits ND1, ND2 and an inverter INV6. The output end of the NAND circuit ND1 is connected to the first input end of the NAND circuit ND2, and the output end of the NAND circuit ND2 is connected to the first input end of the NAND circuit ND1. The second input end of the NAND circuit ND1 is connected to a point toward the gate G of the p-type MOS transistor P4. That is, it is connected to the node A2. The second input end of the NAND circuit ND2 is connected to a point toward the gate G of the p-type MOS transistor P3. that is, it is connected to the node B. Adjacent to the output end of the NAND circuit ND1, a node G2 is provided, and a node H2 is provided adjacent to the output end of the NAND circuit ND2. Connected to the node H2 is an inverter INV6. Output from the inverter INV6 is the output data signal OD. That is, it is the output data signal OD which is the output signal from the voltage level converting flip-flop circuit.

Outside the master latch circuit ML2 and the slave latch circuit SL2 in the drawing, the voltage level converter circuit CLC is provided. That is, the voltage level converting circuit CLC is provided in front of the master latch circuit ML2. The voltage level converter circuit CLC includes p-type MOS transistors P5, P6 and an n-type MOS transistor N7.

The p-type MOS transistor P5 and the n-type MOS transistor N7 are connected in series between the power source of voltage VDD1 and the gate G of he n-type MOS transistor N6. The gate G of the p-type MOS transistor P5 is connected to a node E2 where the n-type MOS transistors N3, N4 and N6 are connected. There is a node F2 between the p-type MOS transistor P5 and the n-type MOS transistor N7. The node F2 is connected to the gate G of the p-type MOS transistor P1, gate G of the p-type MOS transistor P2 and gate G of the p-type MOS transistor P6. The gate G of the n-type MOS transistor N7 is connected to the power source of voltage VDD2. Therefore, the n-type MOS transistor N7 is a normally ON transistor. A clock input terminal is provided between the n-type MOS transistor N7 and the n-type MOS transistor N6 to introduce the clock signal CK. The clock signal CK changes between the ground level and VDD2. Located between the node E2 and the power source of voltage VDD1 is the p-type MOS transistor P6.

Figure 20:
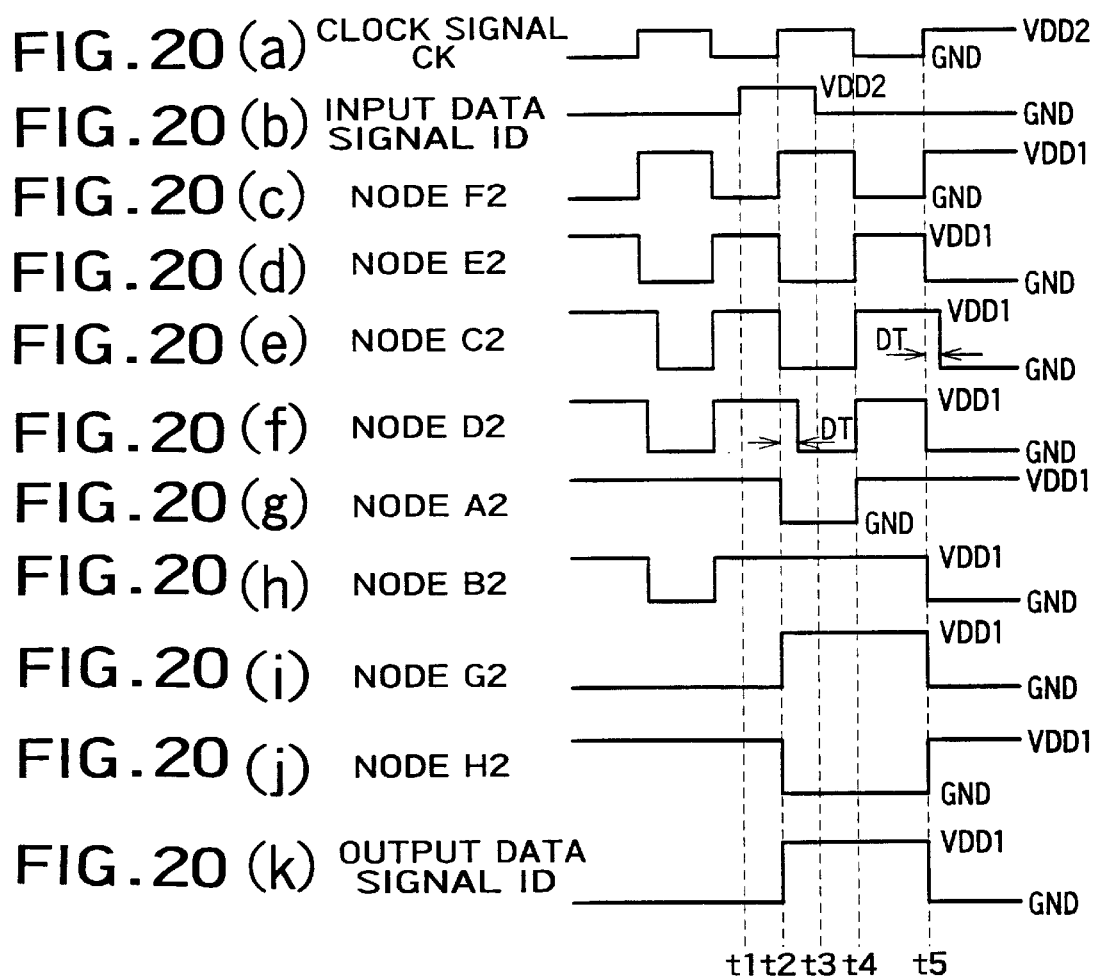
FIGS. 20A–20K are timing charts of signals and voltages in the voltage level converting flip-flop circuit of FIG. 19.

Next explained are behaviors of the voltage level converting flip-flop circuit shown in FIG. 19 with reference to FIG. 20 which is a timing chart of signals and voltages in various portions in the voltage level converting flip-flop circuit. Shown at (a) of FIG. 20 is an aspect of the clock signal CK, and (b) of FIG. 20 shows an aspect of the input data signal ID. These clock signal CK and input data signal ID change between the ground level and VDD2. shown at (c) through (j) of FIG. 20 are aspects of voltages at nodes A2 through H2 which change between the ground level and VDD1. Shown at (k) of FIG. 20 is an aspect of the output data signal OD which changes between the ground level and VDD1.

As best shown at (a), (b) and (k) of FIG. 20, the voltage level converting flip-flop circuit is configured to release a HIGH level output data signal OD during one cycle of the clock signal CK after entry of a HIGH level input data signal ID at a rising edge of the clock signal CK and to increase the voltage from VDD2 to VDD1. Focusing at the master latch circuit ML2 alone, when the introduced clock signal CK is HIGH, it holds the input data signal ID having appeared at the rising of the clock signal CK. That is, the master latch circuit ML2 renders one of the nodes A2 and B2 HIGH and the other LOW, depending upon whether the input data signal ID at the rising edge of the clock signal CK is HIGH or LOW. On the other hand, while the clock signal CK is LOW, it renders both nodes A2 and B2 HIGH regardless of the content of the input data signal ID. The master latch circuit ML2 behaving in this manner is one of roughly classified latch circuits called latch-type sensing amplifiers. This is explained below in greater detail.

As shown in FIG. 19, the clock signal CK is supplied to the gate of the n-type MOS transistor N6 and gates G of the p-type MOS transistors P1, P2 and P6. Assume here that, while the clock signal CK is input, the input data signal ID changes from LOW to HIGH at time t1 as shown at (b) of FIG. 20. At time t1, the clock signal CK is LOW as shown at (a) of FIG. 20, and the n-type MOS transistor N6 is OFF. Therefore, the voltage level converting flip-flop circuit is not affected as shown at (c) through (k) of FIG. 20.

The clock signal CK next changes from LOW to HIGH at time t2 as shown at (a) of FIG. 20. Then, the n-type MOS transistor N6 turns ON. Therefore, as shown at (d) of FIG. 20, the voltage at node E2 becomes the ground level. As a result, the p-type MOS transistor P5 turn ON, and node F2 becomes HIGH as shown at (c) of FIG. 20. The voltage at node F2 is VDD1 higher than the voltage VDD2 of the clock signal CK. Since the node F2 is HIGH, all of the p-type MOS transistors P1, P2 and P6 turn OFF. At that time, the voltage at gates G of the p-type MOS transistors P1, P2 and P6 is VDD1, and the voltage of their sources is also VDD1. Therefore, the p-type MOS transistors P1, P2, and P6 are in sufficiently OFF conditions where no leak current flows.

At time t2, since the input data signal ID is HIGH as shown at (b) of FIG. 20, the n-type MOS transistor N3 is ON, and the n-type MOS transistor N4 is OFF. therefore, node C2 immediately becomes LOW as shown at (e) of FIG. 20. In contrast, node D2 becomes LOW after a delay time DT as shown at (f) of FIG. 20 because the node D2 does not become the ground potential immediately due to the n-type MOS transistor N4 being OFF, but it becomes the ground potential after the ground potential of the node C2 is transmitted through the normally ON n-type MOS transistor N5. At that time, the node B2 is HIGH as shown at (h) of FIG. 20. Therefore, the node A2 immediately becomes LOW as shown at (g) of FIG. 20. Accordingly, the n-type MOS transistor N2 turns OFF, and the p-type MOS transistor P4 turns ON. As a result, since the n-type MOS transistor N2 has already turned OFF when the node D2 becomes LOW as shown at (f) of FIG. 20, the node B2 remains HIGH as shown at (h) of FIG. 20.

Since the node A2 is LOW and the node B2 is HIGH in this manner, the node G2 changes from LOW to HIGH as shown at (i) of FIG. 20, and the node H2 changes from HIGH to LOW. As a result, as shown at (k) of FIG. 20, the output data signal OD changes from LOW to HIGH. The voltage of the output data signal OD is VDD1 higher than the voltage VDD2 of the input data signal ID.

Next assume that the input data signal ID next changes from HIGH to LOW at time t3 as shown at (b) of FIG. 20. However, the clock signal CK remains HIGH as shown at (a) of FIG. 20, and the n-type MOS transistor N6 remains ON. Therefore, the voltage level converting flip-flop circuit is not affected.

The clock signal CK next changes from HIGH to LOW at time t4 as shown at (a) of FIG. 20. Then, all of the p-type MOS transistors P1, P2 and P6 turn ON, and the n-type MOS transistor N6 turns OFF. Since the p-type MOS transistors P1 and P2 are ON and the n-type MOS transistor N6 is OFF, nodes A2 and B2 become HIGH as shown at (g) and (h) of FIG. 20. Therefore, the n-type MOS transistor N1 and N2 turn ON, and nodes C2 and D2 become HIGH as shown at (e) and (f) of FIG. 20. At that time, since the p-type MOS transistor P6 is ON, node E2 becomes HIGH as shown at (d) of FIG. 20. The voltage of the node E2 is VDD1. As a result, the p-type MOS transistor P5 is changed to a sufficiently OFF state not permitting a leak current to flow.

The clock signal CK next changes from LOW to HIGH at time t5 as shown at (a) of FIG. 20. As a result, since the input data signal ID is LOW, the output data signal OD changes from HIGH to LOW through the same process as that of the above-explained behaviors at time t2 upon the rising of the clock signal CK.

As explained above, the voltage level converting flip-flop circuit according to the invention is configured to raise the clock signal CK from VDD2 to VDD1 before the clock signal is input to the master latch circuit ML2 as shown in FIG. 19. Therefore, it does not occur that a leak current flows into the p-type MOS transistors P1 and P2. That is, when the clock signal CK is HIGH, the voltage at the gates G of the p-type MOS transistors P1 and P2 is VDD1 which is equal to the voltage of their sources. Therefore, the p-type MOS transistor P1 and P2 can be changed or held sufficiently OFF to an extent where no leak current flows.

Moreover, the flip-flop circuit shown here needs no threshold voltage VWELL used in the conventional techniques, power sources voltages can be reduced to less kinds of voltages. That is, by using the voltage level converting flip-flop circuit according to the invention, power source voltages can be reduced to two kinds of voltages, namely VDD1 and VDD2. In other words, it is sufficient to use the power source of voltage VDD1 used for activating the voltage level converting flip-flop circuit and others and the power source of voltage VDD2 used for activating the inverter INV5, generating the clock signal CK, and for other purposes. Additionally, since the pMOS transistors can be designed to have a single common threshold voltage, steps of the manufacturing process and the production cost can be reduced.

Moreover, since the n-type MOS transistor N7 is provided between the p-type MOS transistor P5 and the input terminal for introducing the clock signal CK, a reverse current flow can be prevented. That is, it is prevented that a current flows from the p-type MOS transistor P5 toward the input terminal for the clock signal CK because also the voltage value at the gate G of the n-type MOS transistor N7 is VDD2 and no current flows substantially, even when the clock signal CK becomes high, namely VDD2, and the p-type MOS transistor P5 turns ON.

Additionally, since the voltage VDD1 is applied to the gate G of the p-type MOS transistor P5 via the p-type MOS transistor P6 when the clock signal CK is LOW, the p-type MOS transistor P5 can be turned OFF enough to prevent a leak current. That is, since the same voltage as VDD1 of the source of the p-type MOS transistor P5 is applied to the gate G of the same transistor P5, the p-type MOS transistor P5 gets into a sufficiently OFF condition.

The invention is not limited to the third embodiment shown above, but may be changed or modified in various modes. For example, the circuit according to the invention may be used as a latch circuit by removing the slave latch circuit SL2 from the circuit shown in FIG. 19. That is, it can be used as a voltage level converting latch circuit.

The relation among the voltage values VDD1 through VDD4 is not limited to the example suggested above. For example, the input data signal ID and the clock signal CK may be different in amplitude of the voltage. On the other hand, the power source voltages of the p-type MOS transistor P5 and the p-type MOS transistor P6 may be modified appropriately as far as they are equal to each other and equal to or higher than the power source voltages of the p-type MOS transistors P1 through P4. Additionally, it is sufficient to satisfy $V_{ID} \geq V_{INV}$ and $V_{CK} \geq V_{N7G}$ where $V_{N7G}$ is the power source voltage at the gate of the n-type MOS transistor N7, $V_{INV}$ is the power source voltage of the inverter INV5, $V_{ID}$ is the amplitude of the input data signal ID, and $V_{CK}$ is the amplitude of the clock signal CK.

Figure 21:
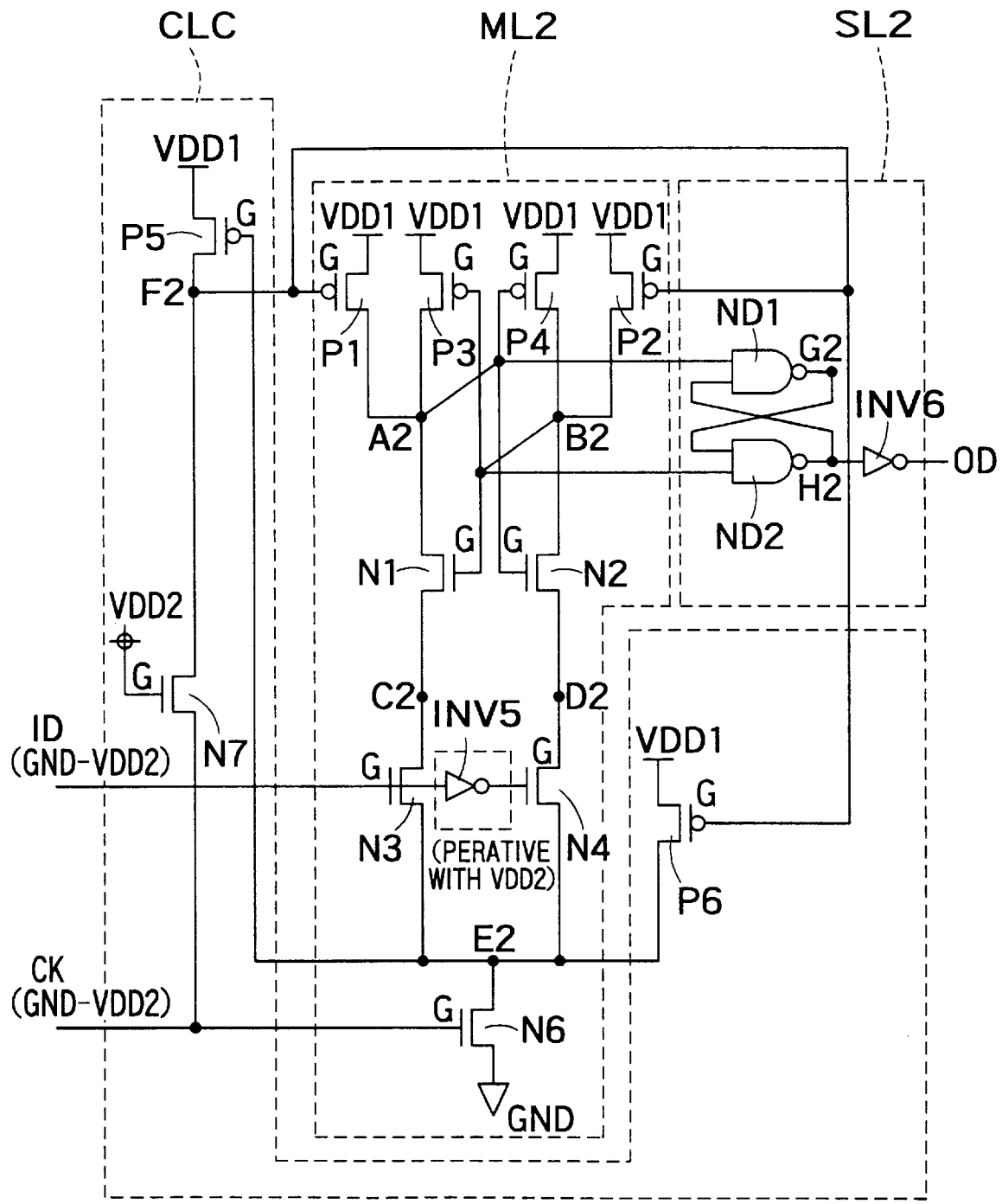
FIG. 21 is a diagram showing a modified version of the voltage level converting flip-flop circuit according to the third embodiment of the invention.
Figure 22:
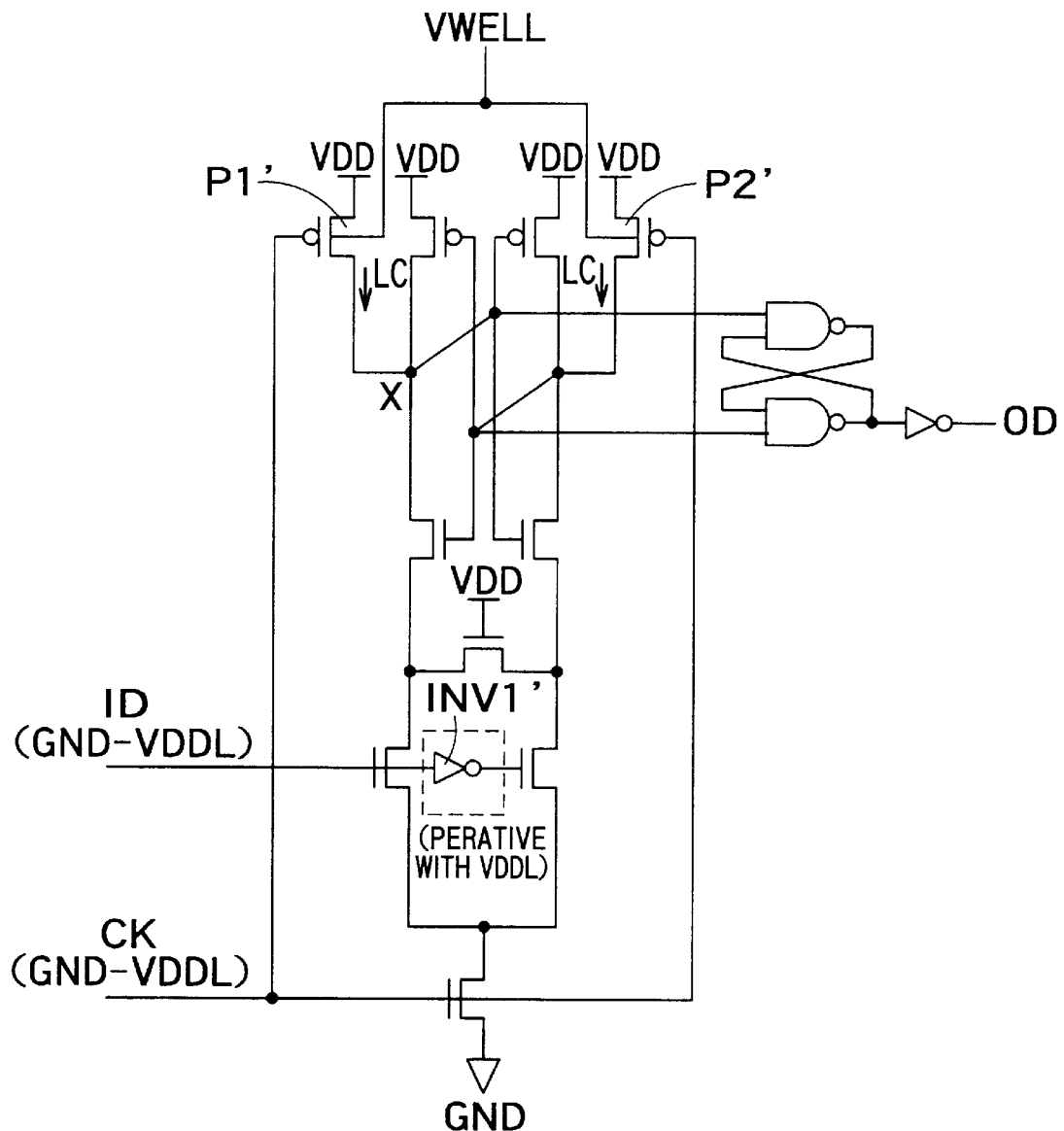
FIG. 22 is a diagram showing a conventional flip-flop circuit.

Furthermore, the n-type MOS transistor N5 shown in FIG. 19 is not indispensable, and may be omitted as shown in FIG. 21. When the n-type MOS transistor N5 is omitted as shown in FIG. 21, nodes C2 and D2 might get into floating conditions when the input data ID changes between LOW and HIGH. However, it is immaterial practically.

As explained above, since the voltage level converting latch circuit or flip-flop circuit has the voltage level converting function in the latch circuit, it contributes to reducing the number of elements, and hence enables reduction of the power consumption and high-speed operation of the circuit.

Additionally, since the clock signal is introduced into the latch circuit and the flip-flop circuit after its voltage level is raised, it is prevented that a leak current flows inside.

What is claimed is:

1. A latch circuit having a voltage level converting function, comprising:

voltage level converting means for converting the voltage level of an input signal and for releasing an output signal with a voltage level different from the voltage level of the input signal; and mode changing means responsive to a control signal to change said voltage level converting means between two modes one of which is for permitting said input signal to pass through and be dealt as said output signal and the other of which is for holding said input signal upon a change of said control signal and for dealing it as said output signal, wherein said voltage level converting means includes:
a first transistor and a second transistor each having an input terminal connected to a first voltage source, and each of said first and second transistors having an output terminal connected to a control terminal of the other of said first and second transistors;
a third transistor and a fourth transistor connected in series between said output terminals of said first and second transistors and a second voltage source to connect or disconnect said first and second transistors to or from said second voltage source in a mutually complementary relation in response to said input signal; and
a data signal output terminal located at least one of locations between said first transistor and said third transistor and between said second transistor and said fourth transistor to extract said output signal, wherein said mode changing means includes:
a fifth transistor connected between the output terminal of said first transistor and a control terminal of said fourth transistor, and having a control terminal supplied with said control signal; and
a sixth transistor connected between the output terminal of said second transistor and a control terminal of said third transistor, and having a control terminal supplied with said control signal.

2. A latch circuit having a voltage level converting function, comprising:

voltage level converting means for converting the voltage level of an input signal and for releasing an output signal with a voltage level different from the voltage level of the input signal; and mode changing means responsive to a control signal to change said voltage level converting means between two modes one of which is form permitting said input signal to pass through and be dealt as said output signal and the other of which is for holding said input signal upon a change of said control signal and for dealing it as said output signal, wherein said voltage level converting means includes:
a first inverter supplied with said input signal;
a second inverter having an input end connected to an output end of said first inverter and an output end for releasing said output signal; and
a first transistor having a control terminal connected between said first inverter and said second inverter, an input terminal connected to a first voltage source, and an output terminal connected to an input end of said first inverter.

3. The latch circuit having a voltage level converting function according to claim 2 wherein said mode changing means includes:
a second transistor connected to the output end of said second inverter and the input end of said first inverter, and having a control terminal supplied with said control signal.

4. A flip-flop circuit having a voltage level converting function, comprising:
a master latch circuit supplied with an input data signal and a control signal, and responsive to said control signal to change between two modes one of which is a pass-through mode for permitting said input data signal to pass through and be dealt as an intermediate output signal and the other of which is a holding mode for holding said input data signal upon a change of said control signal and dealing it as said intermediate output signal; and
a slave latch circuit supplied with said intermediate output signal and said control signal, and responsive to said control signal, said slave latch circuit taking a pass-through mode permitting said intermediate output signal to pass therethrough and be dealt as an output data signal when said master latch circuit is in said holding mode, said slave latch circuit taking a holding mode for holding said intermediate output signal upon a change of said control signal and dealing it as an output data signal when said master latch circuit is in said pass-through mode, and said slave latch circuit converting the voltage level of said intermediate output signal and releasing it as said output data signal with a voltage level different from the voltage level of said intermediate output signal,
wherein said slave latch circuit includes:
a first transistor and a second transistor each having an input terminal connected to a first voltage source, and each of said first and second transistors having an output terminal connected to a control terminal of the other of said first and second transistors;
a third transistor and a fourth transistor connected in series between said output terminals of said first and second transistors and a second voltage source to connect or disconnect said first and second transistors to or from said second voltage source in a mutually complementary relation in response to said intermediate output signal;
a data signal output terminal located at least one of locations between said first transistor and said third transistor and between said second transistor and said fourth transistor to extract said output data signal,
a fifth transistor connected between the output terminal of said first transistor and a control terminal of said fourth transistor, and having a control terminal supplied with said control signal; and
a sixth transistor connected between the output terminal of said second transistor and a control terminal of said third transistor, and having a control terminal supplied with said control signal.

5. The flip-flop circuit having a voltage level converting function according to claim 4 wherein the voltage level of said output data signal is higher than the voltage level of said intermediate output signal.

6. The flip-flop circuit having a voltage level converting function according to claim 4 wherein the voltage level of said output data signal is lower than the voltage level of said intermediate output signal.

7. The flip-flop circuit having a voltage level converting function according to claim 4 wherein at least a part of said slave latch circuit is operative with a first voltage whereas said master latch circuit is operative with a second voltage lower than said first voltage.

8. The flip-flop circuit having a voltage level converting function according to claim 7 wherein said control signal changes between the ground level and a third voltage whereas said input data signal changes between the ground level and a fourth voltage, said third and fourth voltages being not lower than said second voltage.

9. The flip-flop circuit having a voltage level converting function according to claim 8 wherein said third voltage and said fourth voltage are lower than said first voltage.

10. The flip-flop circuit having a voltage level converting function according to claim 9 wherein said third voltage and said fourth voltage are equal to each other.

11. A latch circuit having a voltage level converting function comprising:
a latch circuit for outputting a HIGH level status signal and a LOW level status signal,
holding said HIGH level status signal at a LOW level for a period of time during which a clock signal is HIGH when an input signal is HIGH at a rising of said clock signal,
holding said HIGH level status signal at a HIGH level for a period of time during which said clock signal is HIGH when said input signal is LOW at a rising of said clock signal,
holding said LOW level status signal at a HIGH level for a period of time during which said clock signal is HIGH when said input signal is HIGH at a rising of said clock signal,
holding said LOW level status signal at a LOW level for a period of time during which said clock signal is HIGH when said input signal is LOW at a rising of said clock signal, and
holding said HIGH level status signal and said LOW level status signal at a HIGH level for a period of time during which said clock signal is LOW regardless of whether said input signal is HIGH or LOW; and
a voltage level converting circuit located in a stage before entry of said clock signal to said latch circuit, said voltage level converting circuit raising the voltage level of said clock signal from a second voltage lower than a first voltage to said first voltage and thereafter supplying as a clock signal with said first voltage to said latch circuit,
wherein said latch circuit includes a HIGH level output circuit for outputting said HIGH level status signal from a HIGH level output terminal, and a LOW level output circuit for outputting said LOW level status signal from a LOW level output terminal,
said HIGH level output circuit including:
a first transistor having an input terminal connected to a power source of said first voltage, a control terminal connected to said LOW level output terminal, and an output terminal connected to said HIGH level output terminal;
a second transistor for a precharging purpose having an input terminal connected to the source of said first voltage, a control terminal supplied with said clock signal with said first voltage from said voltage level converting circuit, and an output terminal connected to said HIGH level output terminal;

a third transistor having an input terminal connected to said HIGH level output terminal, and a control terminal connected to said LOW level output terminal; and a fourth transistor having an input terminal connected to an output terminal of said third transistor, and a control terminal supplied with said input signal, said LOW level output circuit including:

a fifth transistor having an input terminal connected to the power source of said first voltage, a control terminal connected to said HIGH level output terminal, and an output terminal connected to said LOW level output terminal;

a sixth transistor for a precharging purpose having an input terminal connected to the power source of said first voltage, a control terminal supplied with said clock signal with said first voltage from said voltage level converting circuit, and an output terminal connected to said LOW level output terminal;

a seventh transistor having an input terminal connected to said LOW level output terminal, and a control terminal connected to said HIGH level output terminal;

an eighth transistor having an input terminal connected to an output terminal of said seventh transistor, and a control terminal supplied with said input signal; and a ninth transistor having an input terminal connected to output terminals of said fourth and eighth transistors, a control terminal supplied with said clock signal with said second voltage, and an output terminal connected to a power source of a third voltage, wherein said voltage level converting circuit includes:

a tenth transistor having an input terminal connected to the power source of said first voltage, an output terminal connected to the control terminals of said second and sixth transistors, and a control terminal connected to the input terminal of said ninth transistor.

12. The latch circuit having a voltage level converting function according to claim 11 wherein said voltage level converting circuit includes an eleventh transistor connected between the output terminal of said tenth transistor and a clock input terminal for introducing said clock signal with said second voltage, said eleventh transistor being normally ON.

13. The latch circuit having a voltage level converting function according to claim 9 wherein said latch circuit includes a twelfth transistor connected between the input terminals of said fourth and eighth transistors, and normally held ON.

14. A flip-flop circuit having a voltage level converting function comprising:

a master latch circuit for outputting a HIGH level status signal and a LOW level status signal, holding said HIGH level status signal at a LOW level for a period of time during which a clock signal is HIGH when an input signal is HIGH at a rising of said clock signal, holding said HIGH level status signal at a HIGH level for a period of time during which said clock signal is HIGH when said input signal is LOW at a rising of said clock signal, holding said LOW level status signal at a HIGH level for a period of time during which said clock signal is HIGH when said input signal is HIGH at a rising of said clock signal, holding said LOW level status signal at a LOW level for a period of time during which said clock signal is HIGH when said input signal is LOW at a rising of said clock signal, and holding said HIGH level status signal and said LOW level status signal at a HIGH level for a period of time during which said clock signal is LOW regardless of whether said input signal is HIGH or LOW; and a voltage level converting circuit located in a stage former than entry of said clock signal to said master latch circuit, said voltage level converting circuit raising the voltage level of said clock signal from a second voltage lower than a first voltage to said first voltage and thereafter supplying as a clock signal with said first voltage to said master latch circuit, and a slave latch circuit operative in responsive to said HIGH level status signal and said LOW level status signal from said master latch circuit to release an output data signal with said first voltage, wherein said master latch circuit includes a HIGH level output circuit for outputting said HIGH level status signal from a HIGH level output terminal, and a LOW level output circuit for outputting said LOW level status signal from a LOW level output terminal, said HIGH level output circuit including:

a first transistor having an input terminal connected to a power source of said first voltage, a control terminal connected to said LOW level output terminal, and an output terminal connected to said HIGH level output terminal;

a second transistor for a precharging purpose having an input terminal connected to the source of said first voltage, a control terminal supplied with said clock signal with said first voltage from said voltage level converting circuit, and an output terminal connected to said HIGH level output terminal;

a third transistor having an input terminal connected to said HIGH level output terminal, and a control terminal connected to said LOW level output terminal; and a fourth transistor having an input terminal connected to an output terminal of said third transistor, and a control terminal supplied with said input signal, said LOW level output circuit including:

a fifth transistor having an input terminal connected to the power source of said first voltage, a control terminal connected to said HIGH level output terminal, and an output terminal connected to said LOW level output terminal;

a sixth transistor for a precharging purpose having an input terminal connected to the power source of said first voltage, a control terminal supplied with said clock signal with said first voltage from said voltage level converting circuit, and an output terminal connected to said LOW level output terminal;

a seventh transistor having an input terminal connected to said LOW level output terminal, and a control terminal connected to said HIGH level output terminal;

an eighth transistor having an input terminal connected to an output terminal of said seventh transistor, and a control terminal supplied with said input signal; and a ninth transistor having an input terminal connected to output terminals of said fourth and eighth transistors, a control terminal supplied with said clock signal with said second voltage, and an output terminal connected to a power source of a third voltage, wherein said voltage level converting circuit includes:
a tenth transistor having an input terminal connected to the power source of said first voltage, an output terminal connected to the control terminals of said second and sixth transistors, and a control terminal connected to the input terminal of said ninth transistor.

15. The flip-flop circuit having a voltage level converting function according to claim 14 wherein said voltage level converting circuit includes an eleventh transistor connected between the output terminal of said tenth transistor and a clock input terminal for introducing said clock signal with said second voltage, said eleventh transistor being normally ON.

16. The flip-flop circuit having a voltage level converting function according to claim 15 wherein said master latch circuit includes a twelfth transistor connected between the input terminals of said fourth and eighth transistors, and normally held ON.

17. The flip-flop circuit having a voltage level converting function according to claim 16 wherein said slave latch circuit includes a first NAND circuit and a second NAND circuit, said first NAND circuit having a first input terminal connected to said HIGH level output terminal, a second input terminal connected to an output terminal of said second NAND circuit, and an output terminal connected to a first input terminal of said second NAND circuit; and said second NAND circuit having a second input terminal connected to said LOW level output terminal and outputting said output data signal from said output terminal of said second NAND circuit.

18. A flip-flop circuit having a voltage level converting finction, comprising:

a master latch circuit supplied with an input data signal and a control signal, and responsive to said control signal to change between two modes one of which is a pass-through mode for permitting said input data signal to pass through and be dealt as an intermediate output signal and the other of which is a holding mode for holding said input data signal upon a change of said control signal and dealing it as said intermediate output signal; and a slave latch circuit supplied with said intermediate output signal and said control signal, and responsive to said control signal, said slave latch circuit taking a pass-through mode permitting said intermediate output signal to pass therethrough and be dealt as an output data signal when said master latch circuit is in said holding mode, said slave latch circuit taking a holding mode for holding said intermediate output signal upon a change of said control signal and dealing it as an output data signal when said master latch circuit is in said pass-through mode, and said slave latch circuit converting the voltage level of said intermediate output signal and releasing it as said output data signal with a voltage level different from the voltage level of said intermediate output signal, wherein said slave latch circuit includes:
a first inverter supplied with said intermediate output signal;
a second inverter having an input end connected to an output end of said first inverter and an output end for releasing said output data signal; and
a first transistor having a control terminal connected between said first inverter and said second inverter, an input terminal connected to a first voltage source, and an output terminal connected to an input end of said first inverter.

19. The flip-flop circuit having a voltage level converting function according to claim 18 wherein said slave latch circuit further includes:

a second transistor connected to the output end of said second inverter and the input end of said first inverter, and having a control terminal supplied with said control signal.

20. The flip-flop circuit having a voltage level converting function according to claim 18 wherein the voltage level of said output data signal is higher than the voltage level of said intermediate output signal.

21. The flip-flop circuit having a voltage level converting function according to claim 18 wherein the voltage level of said output data signal is lower than the voltage level of said intermediate output signal.

22. The flip-flop circuit having a voltage level converting function according to claim 18 wherein at least a part of said slave latch circuit is operative with a first voltage whereas said master latch circuit is operative with a second voltage lower than said first voltage.

23. The flip-flop circuit having a voltage level converting function according to claim 22 wherein said control signal changes between the ground level and a third voltage whereas said input data signal changes between the ground level and a fourth voltage, said third and fourth voltages being not lower than said second voltage.

24. The flip-flop circuit having a voltage level converting function according to claim 23 wherein said third voltage and said fourth voltage are lower than said first voltage.

25. The flip-flop circuit having a voltage level converting function according to claim 24 wherein said third voltage and said fourth voltage are equal to each other.

* * * * *